United States Patent
Otsuki et al.

(10) Patent No.: US 10,651,819 B2
(45) Date of Patent: May 12, 2020

(54) VIBRATOR DEVICE, OSCILLATOR, GYRO SENSOR, ELECTRONIC APPARATUS, AND VEHICLE

(71) Applicant: Seiko Epson Corporation, Tokyo (JP)

(72) Inventors: Tetsuya Otsuki, Fujimi (JP); Tsugio Ide, Minowa (JP)

(73) Assignee: Seiko Epson Corporation (JP)

( * ) Notice: Subject to any disclaimer, the term of this patent is extended or adjusted under 35 U.S.C. 154(b) by 136 days.

(21) Appl. No.: 15/926,571

(22) Filed: Mar. 20, 2018

(65) Prior Publication Data

US 2018/0278235 A1    Sep. 27, 2018

(30) Foreign Application Priority Data

Mar. 24, 2017  (JP) ................................ 2017-058706

(51) Int. Cl.

| | |
|---|---|
| *H03H 9/215* | (2006.01) |
| *H03B 5/32* | (2006.01) |
| *G01C 19/56* | (2012.01) |
| *B81B 3/00* | (2006.01) |
| *H03L 1/02* | (2006.01) |
| *H03H 3/007* | (2006.01) |
| *H03H 9/02* | (2006.01) |
| *H03H 9/05* | (2006.01) |

(Continued)

(52) U.S. Cl.
CPC ........... *H03H 9/215* (2013.01); *B81B 3/0072* (2013.01); *B81B 7/0048* (2013.01); *G01C 19/56* (2013.01); *G01C 19/5621* (2013.01); *H03B 5/32* (2013.01); *H03H 3/0076* (2013.01); *H03H 9/02023* (2013.01); *H03H 9/02102* (2013.01); *H03H 9/02157* (2013.01); *H03H 9/0509* (2013.01); *H03H 9/0542* (2013.01); *H03H 9/0547* (2013.01); *H03H 9/1021* (2013.01); *H03H 9/177* (2013.01); *H03H 9/19* (2013.01); *H03L 1/028* (2013.01); *H03L 1/04* (2013.01)

(58) Field of Classification Search
CPC .... H01L 41/053; H03H 9/215; H03H 9/1007; H03H 9/0519; H03H 9/1021; G01C 19/56
See application file for complete search history.

(56) References Cited

U.S. PATENT DOCUMENTS 9,631,923 B2 *   4/2017  Hunt ....................... G01L 1/246
9,631,926 B2 *   4/2017  Ogura ................ G01C 19/5621
(Continued)

FOREIGN PATENT DOCUMENTS

| JP | 2005-167992 A | 6/2005 |
|---|---|---|
| JP | 2008-504771 A | 2/2008 |

(Continued)

*Primary Examiner* — J. San Martin
(74) *Attorney, Agent, or Firm* — Harness, Dickey & Pierce, P.L.C.

(57) ABSTRACT

A vibrator device includes a vibration element including a vibration portion and a fixed portion, a supporting member to which the fixed portion is attached to support the vibration element, and a first substrate to which the supporting member is attached, the supporting member includes a attaching portion attached to the first substrate, and A1≥A2 is satisfied in a case where an area of a rectangular region including the fixed portion is A1 and an area of a rectangular region including the attaching portion is A2 in a plan view seen from a thickness direction of the vibration element.

19 Claims, 11 Drawing Sheets

(51) Int. Cl.
 *H03H 9/17* (2006.01)
 *H03H 9/19* (2006.01)
 *G01C 19/5621* (2012.01)
 *H03H 9/10* (2006.01)
 *B81B 7/00* (2006.01)
 *H03L 1/04* (2006.01)

(56) References Cited

U.S. PATENT DOCUMENTS

| | | | |
|---|---|---|---|
| 2005/0116587 A1 | 6/2005 | Ono et al. | |
| 2009/0023400 A1 | 1/2009 | Nishio | |
| 2009/0115283 A1 | 5/2009 | Tripard et al. | |
| 2009/0256449 A1* | 10/2009 | Nishimura | H03H 9/0519 310/348 |
| 2012/0235762 A1* | 9/2012 | Ii | H03H 9/177 331/158 |
| 2013/0328452 A1* | 12/2013 | Fujihara | H01L 41/0475 310/365 |
| 2014/0292435 A1* | 10/2014 | Yamada | H03H 9/215 331/158 |
| 2015/0115772 A1* | 4/2015 | Ishii | H03H 9/132 310/318 |
| 2015/0180481 A1 | 6/2015 | Isohata | |
| 2016/0028369 A1* | 1/2016 | Yamamoto | H03B 28/00 331/158 |
| 2016/0087550 A1 | 3/2016 | Nagata et al. | |
| 2016/0197595 A1* | 7/2016 | Obata | H03H 9/1021 331/158 |
| 2018/0151794 A1* | 5/2018 | Kuroyanagi | H03H 9/059 |

FOREIGN PATENT DOCUMENTS

| | | |
|---|---|---|
| JP | 2009-207109 A | 9/2009 |
| JP | 2009-253883 A | 10/2009 |
| JP | 2010-103963 A | 5/2010 |
| JP | 2010-135890 A | 6/2010 |
| JP | 2012-090202 A | 5/2012 |
| JP | 2012-169962 A | 9/2012 |
| JP | 2012-191559 A | 10/2012 |
| JP | 2013-098678 A | 5/2013 |
| JP | 2014-011644 A | 1/2014 |
| JP | 2014-033368 A | 2/2014 |
| JP | 2014-175880 A | 9/2014 |
| JP | 2015-002314 A | 1/2015 |
| JP | 2015-046778 A | 3/2015 |
| JP | 2015-046779 A | 3/2015 |
| JP | 2015-091100 A | 5/2015 |
| JP | 2015-122607 A | 7/2015 |
| JP | 2016-051942 A | 4/2016 |
| JP | 2016-051959 A | 4/2016 |
| JP | 2016-063521 A | 4/2016 |
| JP | 2016-119517 A | 6/2016 |
| JP | 2016-149595 A | 8/2016 |

* cited by examiner

VIBRATOR DEVICE, OSCILLATOR, GYRO SENSOR, ELECTRONIC APPARATUS, AND VEHICLE

BACKGROUND

1. Technical Field

The present invention relates to a vibrator device, an oscillator including the vibrator device, a gyro sensor, an electronic apparatus, and a vehicle.

2. Related Art

In general, a quartz crystal oscillator mounting a vibrator, particularly, a quartz crystal vibrator is used widely as a reference frequency source of a consumer apparatus such as a mobile communication apparatus such as a mobile phone, a radio wave timepiece, and an IC card.

Since the quartz crystal vibrator is supported by a conductive adhesive or the like in a package, in a case where an ambient temperature of the quartz crystal vibrator changes, the hysteresis occurs due to an occurrence of a thermal distortion caused by a difference in a thermal expansion coefficient with a container (package) in a supporting portion supporting a quartz crystal vibrator element, and further, a difference in a degree of recovery of the thermal distortion between the supporting portion and the quartz crystal vibrator element in a case where the temperature of the quartz crystal vibrator returns to an original temperature. That is, a hysteresis phenomenon of temperature characteristics occurs such that it requires a long time for a frequency of the quartz crystal vibrator to return to an original frequency due to a stress from the supporting portion even when the temperature of the quartz crystal vibrator returns to the original temperature, or there is a difference in frequency-temperature dependence of the quartz crystal vibrator at a rise and fall of the temperature when the temperature of the quartz crystal vibrator changes reciprocally between t1 and t2.

JP-A-2014-33368 discloses an oscillator that supports the quartz crystal vibrator element on a pedestal portion having the same material as the quartz crystal and fixes the pedestal portion to the container in order to reduce the thermal distortion caused by the difference in the thermal expansion coefficient between the quartz crystal vibrator element and the pedestal portion, and to suppress the hysteresis in the frequency of the quartz crystal vibrator due to the temperature change, and oscillates a stable reference frequency.

The oscillator disclosed in JP-A-2014-33368 can suppress the hysteresis in the frequency of the quartz crystal vibrator with the distortion caused by the difference in the thermal expansion coefficient between the pedestal portion of the quartz crystal and the quartz crystal vibrator element due to the temperature change. However, since the distortion caused by the difference in the thermal expansion coefficient between the container and the pedestal portion of the quartz crystal cannot be reduced, there is a problem that the hysteresis in which the vibration characteristics with respect to the temperature changes cannot be reduced sufficiently.

SUMMARY

An advantage of some aspects of the invention is to solve at least a part of the problems described above, and the invention can be implemented as the following application examples or forms.

Application Example 1

A vibrator device according to this application example includes a vibration element that includes a vibration portion and a fixed portion, a supporting member to which the fixed portion is attached to support the vibration element, and a substrate to which the supporting member is attached. The supporting member includes an attaching portion attached to the substrate, and A1≥A2 is satisfied in a case where an area of a rectangular region including the fixed portion is A1 and an area of a rectangular region including the attaching portion is A2 in a plan view seen from a thickness direction of the vibration element.

According to the vibrator device of the application example, when the vibrator device is subjected to a temperature cycle in which a temperature change between low temperature and high temperature repeats such as an in-vehicle environment, since the area A2 including the attaching portion of the supporting member attached to the substrate is smaller than the area A1 including the fixed portion of the vibration element attached to the supporting member, it is possible to alleviate a distortion due to a thermal stress caused by a difference in a thermal expansion coefficient between the supporting member and the substrate, and to reduce the transfer of the distortion in which the substrate receives to the vibration element. Accordingly, when the device is subjected to the temperature cycle, it is possible to obtain the vibrator device in which the change in the vibration characteristics such as the frequency change is reduced. Here, the rectangular region including the fixed portion and the rectangular region including the attaching portion refer to minimum rectangular regions including the fixed portion and the attaching portion, respectively.

Application Example 2

In the vibrator device according to the application example, it is preferable that the vibration portion includes a region overlapping the rectangular region including the fixed portion and the rectangular region including the attaching portion in the plan view.

According to this application example, since the vibration portion includes the region overlapping the rectangular region including the fixed portion and the rectangular region including the attaching portion, both ends of the vibration element are supported, and it is possible to prevent the vibration portion from contacting the supporting member and the substrate and to obtain the vibrator device having stable vibration characteristics.

Application Example 3

In the vibrator device according to the application example, it is preferable that a relationship between the A1 and the A2 satisfies $0.1 \leq (A2/A1) \leq 1.0$.

According to this application example, it is possible to alleviate the distortion due to the thermal stress caused by the difference in the thermal expansion coefficient between the supporting member and the substrate while maintaining mechanical strength to attach the supporting member to the substrate, and to reduce the transfer of the distortion in which the substrate receives to the vibration element.

Application Example 4

In the vibrator device according to the application example, it is preferable that the relationship between the A1 and the A2 satisfies $0.5 \leq (A2/A1) \leq 0.8$.

According to this application example, it is possible to alleviate the distortion due to the thermal stress caused by the difference in the thermal expansion coefficient between the supporting member and the substrate while improving and maintaining more stably the mechanical strength to attach the supporting member to the substrate, and to reduce the transfer of the distortion in which the substrate receives to the vibration element.

Application Example 5

In the vibrator device according to the application example, it is preferable that at least apart of the supporting member is made of the same material as the vibration element.

According to this application example, since at least a part of the supporting member is made of the same material as the vibration element, when the vibration element is attached to the supporting member, the distortion due to the thermal stress caused by the difference in the thermal expansion coefficient can be reduced, and the influence of the distortion from the supporting member can be further reduced.

Application Example 6

In the vibrator device according to the application example, it is preferable that the supporting member includes a crystal material having a first crystal orientation, the vibration element includes the same crystal material as the crystal material of the supporting member and a crystal material having a second crystal orientation, and the first crystal orientation is different from the second crystal orientation in the plan view.

According to this application example, since it is possible to increase the Young's modulus as a composite by a combination between the supporting member and the vibration element by making the crystal orientation of the supporting member different from the crystal orientation of the vibration element using the Young's modulus depending on the crystal orientation, the vibration element is less susceptible to the influence of the stress from the substrate, and the vibrator device having the stable vibration characteristics can be obtained.

Application Example 7

In the vibrator device according to the application example, it is preferable that an aspect ratio of the supporting member is different from an aspect ratio of the vibration element in the plan view.

According to this application example, since the aspect ratio of the supporting member is different from the aspect ratio of the vibration element, it is possible to provide a plurality of the fixed portions to the supporting member and a plurality of the attaching portions to the substrate. Therefore, since it is possible to increase the areas of the fixed portions and the areas of the attaching portions, the attaching strength between the supporting member and the vibration element, and the attaching strength between the substrate and the supporting member can be improved respectively, and the vibration element can be mounted stably on the substrate.

Application Example 8

In the vibrator device according to the application example, it is preferable that the substrate includes a plurality of external connection portions, and $A3 \geq A2$ is satisfied in a case where an area of a rectangular region including the plurality of external connection portions is $A3$ in the plan view.

According to this application example, when the vibrator device is mounted on a mounting substrate of an electronic apparatus or the like through the external connection portion, since the area $A2$ including the attaching portion of the supporting member attached to the substrate is smaller than the area $A3$ including the plurality of external connection portions, only the distortion related to the region of the attaching portion is transferred to the supporting member among distortions due to the thermal stress caused by the difference in the thermal expansion coefficient between the substrate of the vibrator device and the mounting substrate. Therefore, it is possible to alleviate the distortion due to the stress from the mounting substrate when the vibrator device is mounted on the mounting substrate of the electronic apparatus or the like, and to obtain the vibrator device having the stable vibration characteristics. Here, the rectangular region including the external connection portions refers to a minimum rectangular region including the external connection portions.

Application Example 9

In the vibrator device according to the application example, it is preferable that a relationship between the A2 and the A3 satisfies $1 \leq (A2/A3) \leq 100$.

According to this application example, it is possible to make the distortion due to the thermal stress caused by the difference in the thermal expansion coefficient between the substrate of the vibrator device and the mounting substrate less likely to be transferred by making the area A2 including the attaching portion of the supporting member attached to the substrate smaller than the area A3 including the plurality of external connection portions.

Application Example 10

In the vibrator device according to the application example, it is preferable that a relationship between the A2 and the A3 satisfies $2 \leq (A2/A3) \leq 5$.

According to this application example, it is possible to make the distortion due to the thermal stress caused by the difference in the thermal expansion coefficient between the substrate of the vibrator device and the mounting substrate hard to be transferred while achieving a miniaturization.

Application Example 11

In the vibrator device according to the application example, it is preferable that the vibration element includes a base portion, the vibration portion extending from the base portion, and a plurality of supporting arms extending from the base portion, and each of the plurality of supporting arms includes the fixed portion and a meandering shape portion.

According to this application example, since the meandering shape portion for alleviating the distortion generated during attaching the vibration element to the supporting arm extending from the base portion is included, it is possible to reduce the influence of the distortion due to the thermal stress with the substrate through the supporting member by deformation of the meandering shape portion when the fixed portion is attached to the supporting member.

Application Example 12

An oscillator according to this application example includes the vibrator device according to the application example described above, and an oscillation circuit that oscillates the vibrator device.

According to this application example, it is possible to obtain the oscillator capable of stably extracting a desired frequency by including the vibrator device in which the influence of the distortion due to the thermal stress when mounting the vibration element is reduced.

Application Example 13

A gyro sensor according to this application example includes the vibrator device according to the application example described above, and a drive circuit that drives the vibrator device.

According to this application example, it is possible to obtain the gyro sensor having a highly accurate detection function by including the vibrator device in which the influence of the distortion due to the thermal stress when mounting the vibration element is reduced.

Application Example 14

An electronic apparatus according to this application example includes the vibrator device according to the application example described above.

According to this application example, it is possible to obtain a high performance electronic apparatus by including the vibrator device in which the influence of the distortion due to the thermal stress when mounting the vibration element is reduced.

Application Example 15

A vehicle according to this application example includes the vibrator device according to the application example described above.

According to this application example, it is possible to obtain a high performance vehicle by including the vibrator device in which the influence of the distortion due to the thermal stress when mounting the vibration element is reduced.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention will be described with reference to drawings. The following description is one embodiment of the invention and does not limit the invention. In the following respective drawings, there are cases of employing a scale different from an actual scale in order to describe the drawings in an easy-to-understand manner.

Vibrator Device

First Embodiment

As a vibrator device according to a first embodiment to a third embodiment of the invention, a vibrator device mounted with a vibration element configured to have an AT cut quartz crystal substrate that has a mesa shape having projection portions in the center portion and generates a thickness shear vibration will be described as an example.

First, a vibrator device 1 according to the first embodiment of the invention will be described with reference to FIGS. 1A to 1D.

Figure 1A:
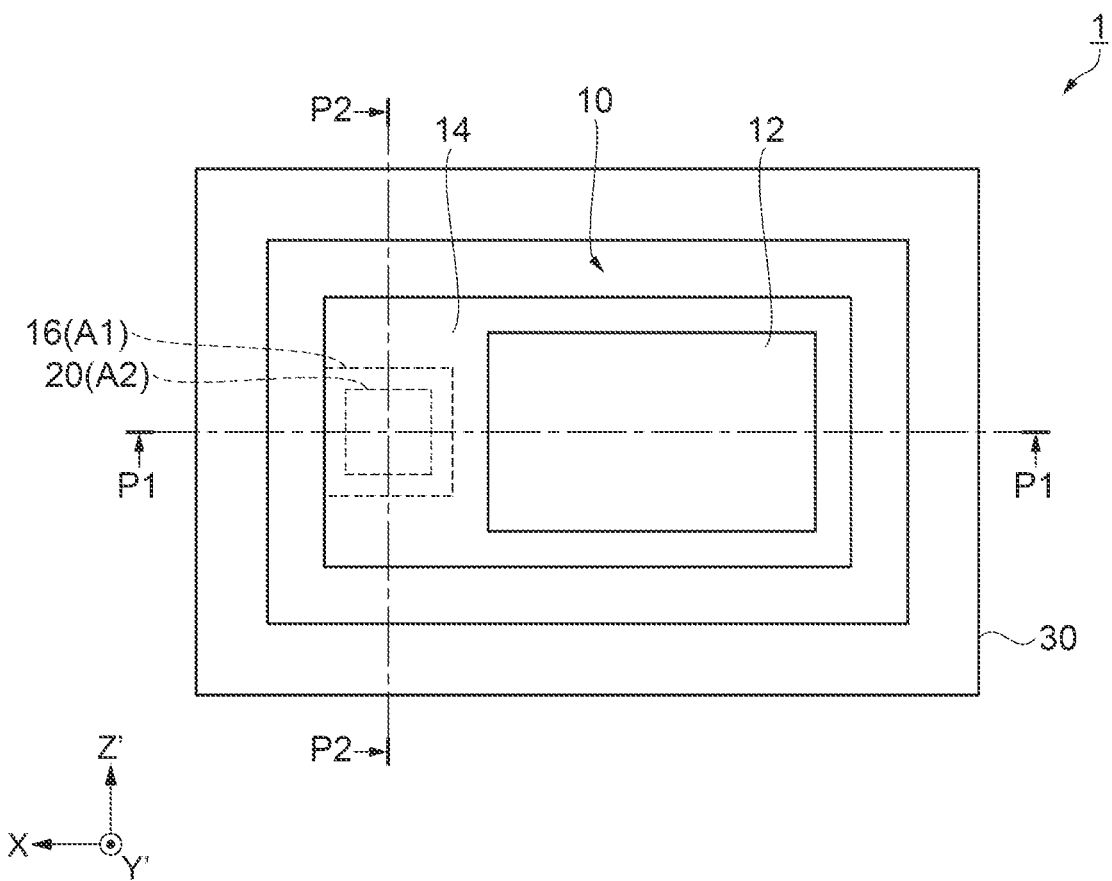
FIG. 1A is a schematic plan view illustrating a configuration of a vibrator device according to a first embodiment.
Figure 1B:
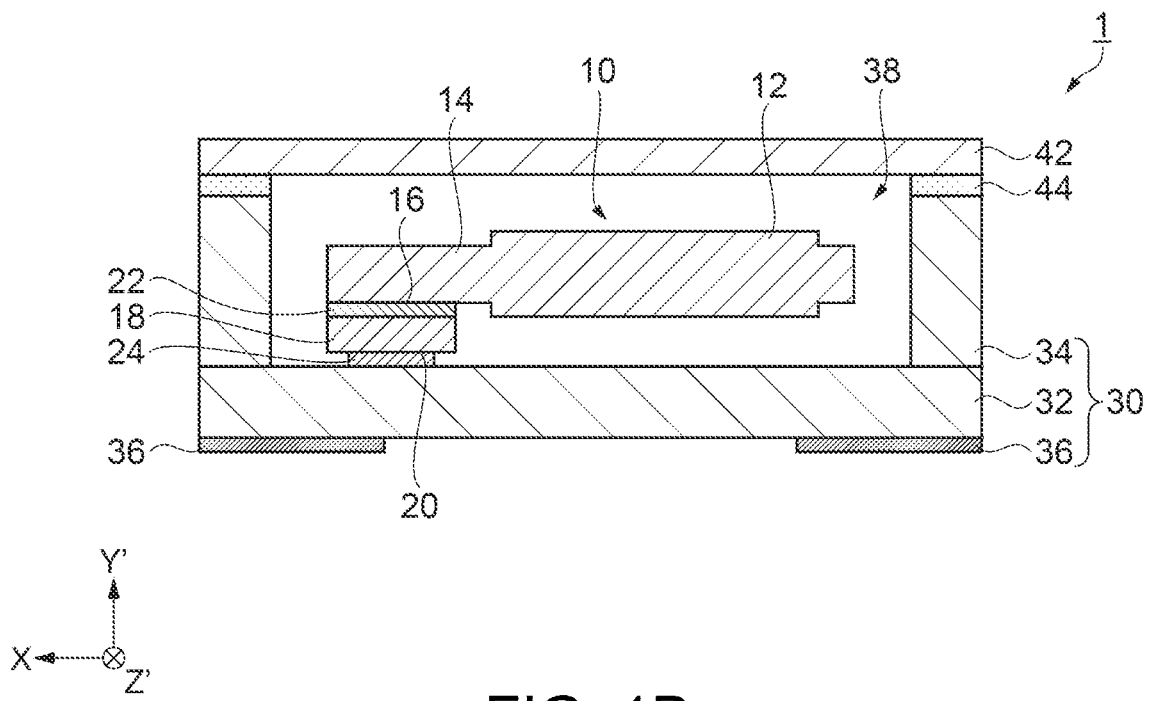
FIG. 1B is a schematic cross-sectional view taken along the line P1-P1 in FIG. 1A.
Figure 1C:
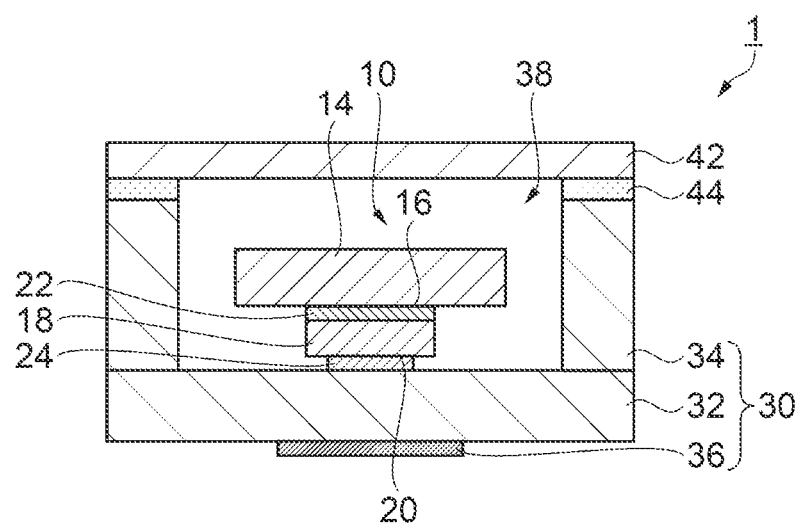
FIG. 1C is a schematic sectional view taken along the line P2-P2 in FIG. 1A.
Figure 1D:
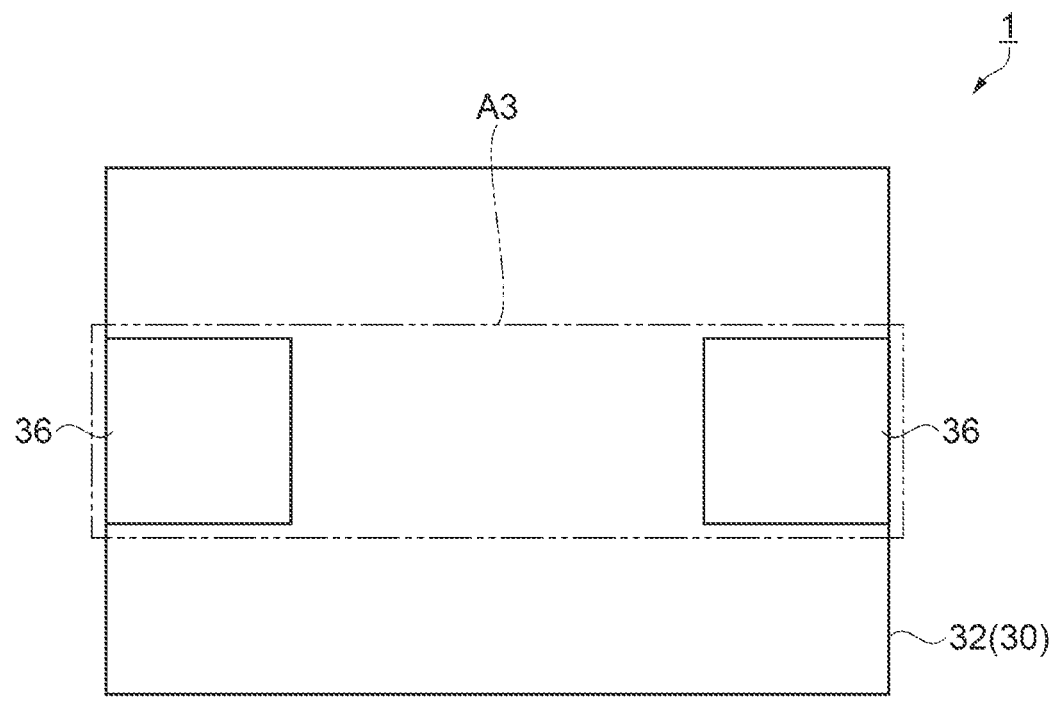
FIG. 1D is a schematic plan view illustrating a configuration of a rear surface of FIG. 1A.

FIG. 1A is a schematic plan view illustrating a configuration of a vibrator device 1 according to the first embodiment. FIG. 1B is a schematic cross-sectional view taken along the line P1-P1 in FIG. 1A. FIG. 1C is a schematic sectional view taken along the line P2-P2 in FIG. 1A. FIG. 1D is a schematic plan view illustrating a configuration of a rear surface of FIG. 1A. FIG. 1A illustrates a state where a lid member 42 is removed for convenience to describe an internal configuration of the vibrator device 1. For convenience of description, FIG. 4B referred to in FIG. 1A and the following illustrates X-axis, Y'-axis, and Z'-axis as three axes orthogonal to one another, and since each axis matches a crystal direction of the quartz crystal, it will be described in detail in FIG. 2 described below. In the following description, for convenience of description, a plan view seen from the Y'-axis direction which is a thickness direction of a vibration element 10 is also referred to simply as "plan view". For convenience of description, in the plan view seen from the Y'-axis direction (tip end direction of arrow), a surface of a +Y'-axis direction (arrow direction) will be described as the upper surface, and a surface of a −Y'-axis direction (direction opposite to arrow direction) will be described as the lower surface.

As illustrated in FIGS. 1A to 1C, the vibrator device 1 according to the first embodiment is configured to have the vibration element 10, a supporting member 18 supporting the vibration element 10, and a package body 30 for housing the vibration element 10 attached to the supporting member 18, and the supporting member 18 and the vibration element 10 are stacked in a cavity 38 of the package body 30 in this order.

The vibration element 10 is configured to have a vibration portion 12 having a thicker thickness (length in Y'-axis direction) than a peripheral portion and having projected upper and lower surfaces, and a thin portion 14 including a fixed portion 16 around the vibration portion 12. Here, the fixed portion 16 of the vibration element 10 refers to a region fixed in contact with an attaching member 22. The vibration element 10 has a rectangular shape in a plan view and is provided at a position where the vibration portion 12 is closer to one end portion side than the center of the longitudinal direction (X-axis direction), and the fixed portion 16 for attaching and fixing to the supporting member 18 is provided at a position close to the other end portion side of the vibration element 10. Therefore, the vibration element 10 is supported by the supporting member 18 by attaching the fixed portion 16 to the supporting member 18.

A material configuring the vibration element 10 is the AT cut quartz crystal substrate and has vibration characteristics excellent in temperature characteristics. The vibration portion 12 generates the thickness shear vibration by applying a voltage to an excitation electrode (not illustrated) provided on the upper surface and the lower surface of the vibration portion 12. Since the vibration portion 12 has the mesa shape having the projection portions, it is possible to prevent vibration energy of the thickness shear vibration from leaking to the thin portion 14 other than the vibration portion 12 and to have stable vibration characteristics.

The supporting member 18 has a rectangular form in a plan view and has substantially the same area as the fixed portion 16 of the vibration element 10. An attaching portion 20 attached to a first substrate 32 of the package body 30 through an attaching member 24 is provided on the lower surface of the supporting member 18. Here, the attaching portion 20 of the supporting member 18 refers to a region in contact with an attaching member 24. A material configuring the supporting member 18 is the AT cut quartz crystal substrate similarly to the vibration element 10. As a result, in a case where the vibration element 10 is attached to the supporting member 18, a distortion due to a thermal stress is significantly small.

The package body 30 is formed by stacking the first substrate 32 and a second substrate 34 as the substrate, and amounting terminal 36 as an external connection portion. The package body 30 has the cavity 38 that opens to a vibration element 10 side. It is possible to obtain the vibrator device 1 in which the inside of the cavity 38 is hermetically sealed by attaching the supporting member 18, to which the vibration element 10 is attached, in the cavity 38 and attaching the lid member 42 with a sealing member 44 such as borosilicate glass.

A material configuring the first substrate 32 and the second substrate 34 is, for example, various ceramics such as oxide-based ceramics, nitride-based ceramics, and carbide-based ceramics.

A material configuring the mounting terminal 36 is subjected to plating with nickel (Ni), gold (Au), or the like on a metal wiring material such as tungsten (W) or molybdenum (Mo).

Two wirings electrically conducted with two mounting terminals 36 formed on the lower surface of the first substrate 32 is provided on the upper surface of the first substrate 32, and one wiring is conducted electrically with the excitation electrode formed on the upper surface of the vibration element 10 by wire bonding or the like. The excitation electrode formed on the lower surface of the vibration element 10 is conducted electrically with the other wiring through a conductive layer continuously formed on the upper surface, the lower surface, and the side surface of the attaching members 22 and 24 such as conductive adhesive, and the supporting member 18. Therefore, when a voltage is applied between two mounting terminals 36 formed on the lower surface of the first substrate 32, the voltage is applied to the excitation electrode formed on the upper and lower surfaces of the vibration element 10 and the vibration element 10 can be excited.

Next, a mounting structure of the vibrator device 1 will be described in detail.

In the vibrator device 1, the attaching portion 20 of the supporting member 18 is attached on the upper surface of the first substrate 32 as the substrate configuring the package body 30 through the attaching member 24, and the fixed portion 16 of the vibration element 10 is attached and fixed on the upper surface of the supporting member 18 through the attaching member 22. Accordingly, since the vibration element 10 is mounted on the upper surface of the first substrate 32 through the supporting member 18, it is possible to alleviate the distortion due to the thermal stress caused by a difference in a thermal expansion coefficient between the first substrate and the vibration element 10. A thermal expansion coefficient of the ceramic which is the material configuring the first substrate 32 is $7.5 \times 10^{-6}$/K, and a thermal expansion coefficient of the AT cut quartz crystal substrate which is the material configuring the vibration element 10 is $13.2 \times 10^{-6}$/K.

Since an area A2 of a rectangular region including the attaching portion 20 of the supporting member 18 is designed to be smaller than an area A1 of a rectangular region including the fixed portion 16 of the vibration element 10 such that A1≥A2, it is possible to reduce a distortion region due to the thermal stress caused by a difference in a thermal expansion coefficient between the supporting member 18 and the first substrate 32, and the distortion due to the thermal stress is hardly transferred from the fixed portion 16 to the vibration portion 12 of the vibration element 10. Since the distortion due to the thermal stress in the attaching portion 20 is attenuated until it reaches the fixed portion 16 as a thickness (length in Y'-axis direction) of the supporting member 18 is thicker, it is possible to further reduce the influence of the distortion due to the thermal stress.

It is preferable that a relationship between the area A1 of the fixed portion 16 and the area A2 of the attaching portion 20 satisfies 0.1≤(A2/A1)≤1.0 in order to alleviate the distortion due to the thermal stress caused by the difference in the thermal expansion coefficient between the supporting member 18 and the first substrate 32 while maintaining mechanical strength to attach the supporting member 18 to the first substrate 32.

More preferably, it is possible to improve and maintain more stably the mechanical strength to attach the supporting member 18 to the first substrate 32 by satisfying 0.5≤(A2/A1)≤0.8.

As illustrated in FIG. 1D, the mounting terminal 36 is provided as two external connection portions in the center portion in a short side direction (Z'-axis direction) on the rear surface (lower surface of first substrate 32) of the vibrator device 1. In a plan view, an area A3 of a rectangular region including two mounting terminals 36 is designed to be larger than the area A2 including the attaching portion 20 of the supporting member 18 attached to the first substrate 32 such that A3≥A2. Therefore, when the vibrator device 1 is mounted on a mounting substrate or the like on which an oscillation circuit and various parts are mounted, a distortion in only a region related to the area A2 of the attaching portion 20 is transferred to the fixed portion 16 among distortions due to the thermal stress caused by a difference in a thermal expansion coefficient between the first substrate 32 of the vibrator device 1 and the mounting substrate generated between two mounting terminals 36. Accordingly, it is possible to alleviate the distortion due to the thermal stress caused by the first substrate 32 and the mounting substrate, and to reduce the influence of the distortion due to the thermal stress.

It is preferable that a relationship between the area A3 of two mounting terminals 36 and the area A2 of the attaching portion 20 satisfies 1≤(A2/A3)≤100 in order to significantly alleviate the distortion due to the thermal stress caused by the first substrate 32 and the mounting substrate.

More preferably, while achieving a miniaturization, the distortion due to the thermal stress caused by the first substrate 32 and the mounting substrate can be alleviated significantly, and the distortion due to the thermal stress can be hardly transferred to the vibration element 10 by satisfying 2≤(A2/A3)≤5.

Next, a quartz crystal substrate configuring the vibration element 10 will be described with reference to FIG. 2.

Figure 2:
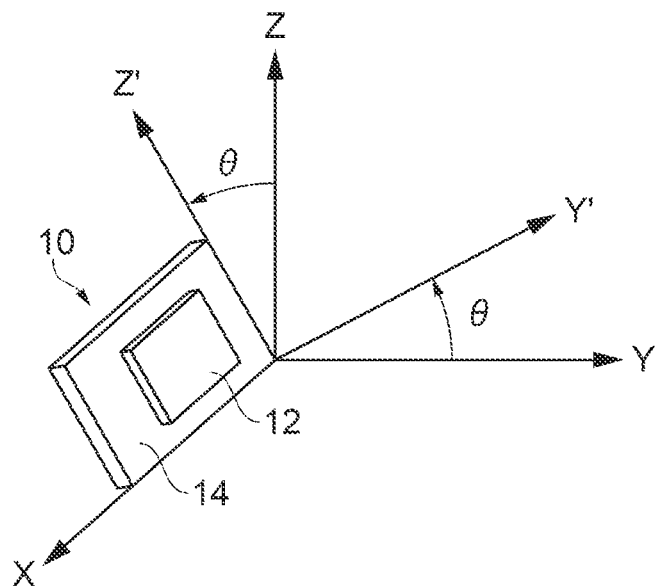
FIG. 2 is a diagram for describing a relationship between an AT cut quartz crystal substrate and crystal axes.

FIG. 2 is a diagram for describing a relationship between the AT cut quartz crystal substrate and crystal axes.

As illustrated in FIG. 2, the quartz crystal substrate configuring the vibration element 10 has the crystal axes X, Y, and Z orthogonal to one another, and the X-axis is referred to as electrical axis, the Y-axis is referred to as mechanical axis, and the Z-axis is referred to as optical axis. The substrate is a flat plate cut along a plane obtained by rotating the XZ plane around the X-axis by a predetermined angle θ, and is a rotated Y-cut quartz crystal substrate.

In a case where the angle θ of the rotated Y-cut quartz crystal substrate is 35.25° (35°15'), it is referred to as the AT cut quartz crystal substrate, and has excellent temperature characteristics. Here, the AT cut quartz crystal substrate has the crystal axes X, Y, and Z orthogonal to one another, the thickness direction is Y'-axis, a plane including the X-axis and the Z'-axis orthogonal to the Y'-axis is a principal plane, and the thickness shear vibration is excited as a main vibration on the principal plane of the vibration portion 12.

In the embodiment, the vibration element 10 configured by the AT cut quartz crystal substrate having the mesa shape is described as one example, but the invention is not limited thereto and a quartz crystal substrate having a flat plate shape may be employed.

The material configuring the vibration element 10 is not limited to the AT cut quartz crystal substrate, and may be a BT cut quartz crystal substrate having an angle θ of 49°. Further, it is not limited to the quartz crystal substrate, and may be lithium niobate ($LiNbO_3$), lithium tantalate ($LiTaO_3$), lithium tetraborate ($Li_2B_4O_7$), potassium niobate ($KNbO_3$), gallium phosphate ($GaPO_4$), langasite crystal ($La_3Ga_5SiO_{14}$), or the like.

As described above, it is possible to obtain the following effects with the vibrator device 1 according to the first embodiment.

When the vibrator device 1 is subjected to a temperature cycle in which a temperature change between low temperature and high temperature repeats, since the minimum rectangular area A2 including the attaching portion 20 of the supporting member 18 attached to the first substrate 32 is smaller than the minimum rectangular area A1 including the fixed portion 16 of the vibration element 10 attached to the supporting member 18, it is possible to alleviate the distortion due to the thermal stress caused by the difference in the thermal expansion coefficient between the supporting member 18 and the first substrate 32, and to reduce the transfer of the distortion in which the first substrate 32 receives to the vibration element 10. Accordingly, when the device is subjected to the temperature cycle, it is possible to obtain the vibrator device 1 in which the change in the vibration characteristics such as the frequency change is reduced.

When the vibration element 10 is mounted on the first substrate 32, since the supporting member 18 is interposed, it is possible to alleviate the distortion due to the thermal stress caused by the difference in the thermal expansion coefficient between the vibration element 10 and the first substrate 32. Since the area A2 including the attaching portion 20 of the supporting member 18 attached to the first substrate 32 is smaller than the area A1 including the fixed portion 16 of the vibration element 10 attached to the supporting member 18, that is, A1≥A2, when attaching the supporting member 18 to the first substrate 32, it is possible to alleviate the distortion due to the thermal stress caused by the difference in the thermal expansion coefficient between the supporting member 18 and the first substrate 32, and to reduce the transfer of the distortion when mounting the supporting member 18 to the vibration element 10. Accordingly, it is possible to obtain the vibrator device 1 in which deterioration of the vibration characteristics such as the frequency change before and after mounting on the first substrate 32, and the aging change due to the distortion during the mounting is reduced.

It is preferable that the relationship between the area A1 of the fixed portion 16 and the area A2 of the attaching portion 20 satisfies 0.1≤(A2/A1)≤1.0, and more preferably, satisfies 0.5≤(A2/A1)≤0.8 in order to alleviate the distortion due to the thermal stress caused by the difference in the thermal expansion coefficient between the supporting member 18 and the first substrate 32 while maintaining the mechanical strength to attach the supporting member 18 to the first substrate 32.

Since at least a part of the supporting member 18 is made of the same material as the vibration element 10, it is possible to reduce the distortion due to the thermal stress caused by the difference in the thermal expansion coefficient, and to reduce the influence of the distortion from the supporting member 18 in the state where the vibration element 10 is attached to the supporting member 18.

When the vibration element 10 is attached to the supporting member 18, since there is almost no distortion due to the thermal stress caused by the difference in the thermal expansion coefficient, it is possible to further reduce the influence of the distortion during the attaching to the supporting member 18.

When the vibrator device 1 is mounted on the mounting substrate of the electronic apparatus or the like through the mounting terminal 36, since the area A2 including the attaching portion 20 of the supporting member 18 attached to the first substrate 32 is smaller than the area A3 including the plurality of the mounting terminals 36, only the distortion related to the region of the attaching portion 20 is transferred to the supporting member 18 among distortions due to the thermal stress caused by the difference in the thermal expansion coefficient between the first substrate 32 of the vibrator device 1 and the mounting substrate. Therefore, it is possible to alleviate the distortion due to the stress from the mounting substrate when mounted on the mounting substrate of the electronic apparatus or the like, and to obtain the vibrator device 1 having the stable vibration characteristics.

It is preferable that the relationship between the area A3 of the plurality of the mounting terminals 36 and the area A2 of the attaching portion 20 satisfies 1≤(A2/A3)≤100, and more preferably, satisfies 2≤(A2/A3)≤5 in order to significantly alleviate the distortion due to the thermal stress caused by the first substrate 32 and the mounting substrate.

Second Embodiment

Next, a vibrator device 1a according to the second embodiment of the invention will be described with reference to FIGS. 3A and 3B.

Figure 3A:
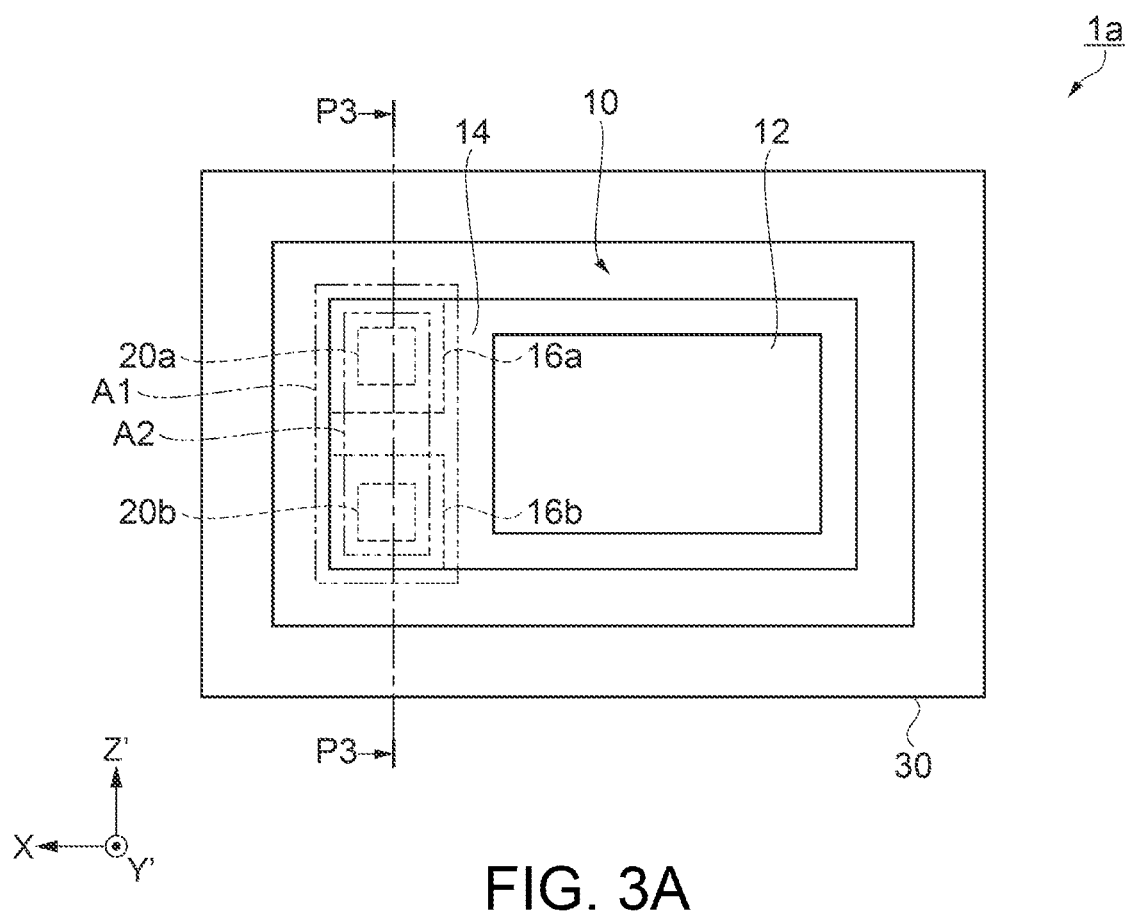
FIG. 3A is a schematic plan view illustrating a configuration of a vibrator device according to a second embodiment.
Figure 3B:
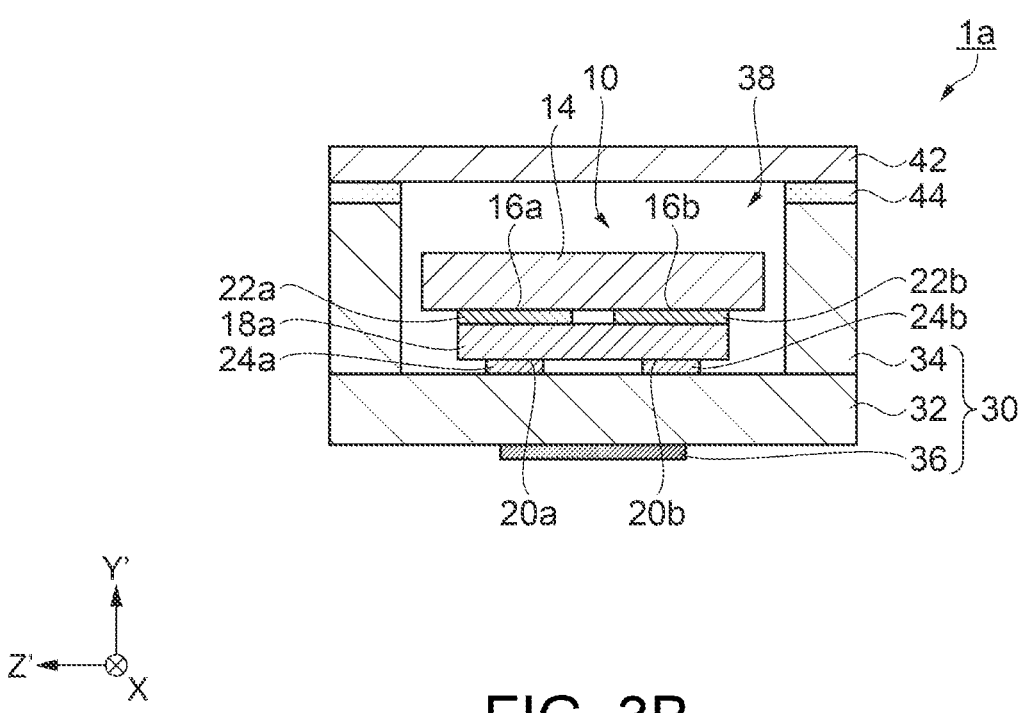
FIG. 3B is a schematic sectional view taken along the line P3-P3 in FIG. 3A.

FIG. 3A is a schematic plan view illustrating a configuration of a vibrator device 1a according to a second embodiment, and FIG. 3B is a schematic sectional view taken along the line P3-P3 in FIG. 3A. FIG. 3A illustrates a state where the lid member 42 is removed for convenience to describe an internal configuration of the vibrator device 1a. The differences from the embodiment described above will be described mainly, the same reference numerals will be assigned to the same configurations, and the description of the same matters will be omitted.

The vibrator device 1a according to the second embodiment has different structures and configurations of a supporting member 18a, fixed portions 16a and 16b, and attaching portions 20a and 20b as compared with the vibrator device 1 according to the first embodiment.

As illustrated in FIGS. 3A and 3B, the vibrator device 1a according to the embodiment is configured to have the vibration element 10, a rectangular supporting member 18a in which the longitudinal direction is a direction (Z'-axis direction) intersecting with the longitudinal direction (X-axis direction) of the vibration element 10, and the package body 30 for housing the vibration element 10 attached to the supporting member 18a.

Since an aspect ratio (defined as a ratio between a length of the X-axis direction and a length of the Z'-axis direction in the embodiment) of the supporting member 18a is the longitudinal direction of the Z'-axis direction, and an aspect ratio of the vibration element 10 is the longitudinal direction of the X-axis direction, the aspect ratio of the supporting member 18a is different from the aspect ratio of the vibration element 10. Accordingly, since the supporting member 18a is long in the Z'-axis direction, it is possible to dispose a plurality of the fixed portions 16a and 16b of the vibration element 10 and a plurality of the attaching portions 20a and 20b of the supporting member 18a along the Z'-axis, and to improve attaching strength between the supporting member 18a and the vibration element 10, and attaching strength between the first substrate 32 and the supporting member 18a.

The vibration element 10 is attached and fixed to the supporting member 18a through the attaching members 22a and 22b such as the conductive adhesive in two fixed portions 16a and 16b aligned along the Z'-axis provided in the thin portion 14.

The supporting member 18a to which the vibration element 10 is attached is attached to the first substrate 32 as the substrate through attaching members 24a and 24b such as the conductive adhesive in two attaching portions 20a and 20b aligned along the Z'-axis.

Since an area A2 including the two attaching portions 20a and 20b of the supporting member 18a attached to the first substrate 32 is designed to be smaller than an area A1 including the two fixed portions 16a and 16b of the vibration element 10 attached to the supporting member 18a, it is possible to obtain the same effects as the first embodiment.

When a crystal material of the supporting member 18a is a first crystal orientation and a crystal material of the vibration element 10 is a second crystal orientation, it is possible to increase the Young's modulus as a composite by a combination between the supporting member 18a and the vibration element 10 by making the first crystal orientation of the supporting member 18a different from the second crystal orientation of the vibration element 10 in a plan view using the Young's modulus depending on the crystal orientation. Therefore, the vibration element 10 is less susceptible to the influence of the stress from the first substrate 32, and the vibrator device 1a having the stable vibration characteristics can be obtained.

For example, when a gold bump, a solder bump, or the like is used instead of the conductive adhesive, it is possible to reduce the frequency variation due to a gas generated during curing of the conductive adhesive by configuring the attaching members 22a and 22b for attaching the vibration element 10 to the supporting member 18a and the attaching members 24a and 24b for attaching the supporting member 18a to the first substrate 32 with different materials. Accordingly, it is possible to obtain the vibrator device 1a having the stable vibration characteristics.

As described above, it is possible to obtain the following effects with the vibrator device 1a according to the second embodiment.

Since the area A2 including the two attaching portions 20a and 20b of the supporting member 18a attached to the first substrate 32 is designed to be smaller than the area A1 including the two fixed portions 16a and 16b of the vibration element 10 attached to the supporting member 18a, that is, A1≥A2, when the vibrator device 1a is subjected to the temperature cycle such as an in-vehicle environment, it is possible to alleviate the distortion due to the thermal stress caused by the difference in the thermal expansion coefficient between the supporting member 18a and the first substrate 32, and to reduce the transfer of the distortion in which the first substrate 32 receives to the vibration element 10. Accordingly, when the device is subjected to the temperature cycle, it is possible to obtain the vibrator device 1a in which the change in the vibration characteristics such as the frequency change is reduced.

When the supporting member 18a is attached to the first substrate 32, it is possible to alleviate the distortion due to the thermal stress caused by the difference in the thermal expansion coefficient between the supporting member 18a and the first substrate 32, and to reduce the transfer of the distortion when mounting the supporting member 18a to the vibration element 10. Accordingly, it is possible to obtain the vibrator device 1 in which deterioration of the vibration characteristics such as the frequency change before and after mounting on the first substrate 32, and the aging change due to the distortion during the mounting is reduced.

Since the aspect ratio of the supporting member 18a is different from the aspect ratio of the vibration element 10, it is possible to provide the plurality of the fixed portions 16a and 16b to the supporting member 18a and the plurality of the attaching portions 20a and 20b to the first substrate 32. Therefore, since it is possible to increase the areas of the fixed portions 16a and 16b and the areas of the attaching portions 20a and 20b, the attaching strength between the supporting member 18a and the vibration element 10, and the attaching strength between the first substrate 32 and the supporting member 18a can be improved respectively, and the vibration element 10 can be mounted stably on the first substrate 32.

It is possible to increase the Young's modulus as the composite by the combination between the supporting member 18a and the vibration element 10 by making the first crystal orientation of the supporting member 18a different from the second crystal orientation of the vibration element 10 in a plan view using the Young's modulus depending on the crystal orientation. Therefore, the vibration element 10 is less susceptible to the influence of the stress from the first substrate 32, and the vibrator device 1a having the stable vibration characteristics can be obtained.

Since the difference in the thermal expansion coefficient between the supporting member 18a and the vibration element 10 can be made different by making the crystal orientation of the supporting member 18a different from the crystal orientation of the vibration element 10, it is possible to configure the attaching members 22a and 22b for attaching the vibration element 10 to the supporting member 18a and the attaching members 24a and 24b for attaching the supporting member 18a to the first substrate 32 with different materials. Accordingly, it is possible to reduce the influence of a gas or the like generated from the attaching members 22a, 22b, 24a, and 24b during the mounting, and obtain the vibrator device 1a having the stable vibration characteristics.

Third Embodiment

Next, a vibrator device 1b according to a third embodiment of the invention will be described with reference to FIGS. 4A and 4B.

Figure 4A:
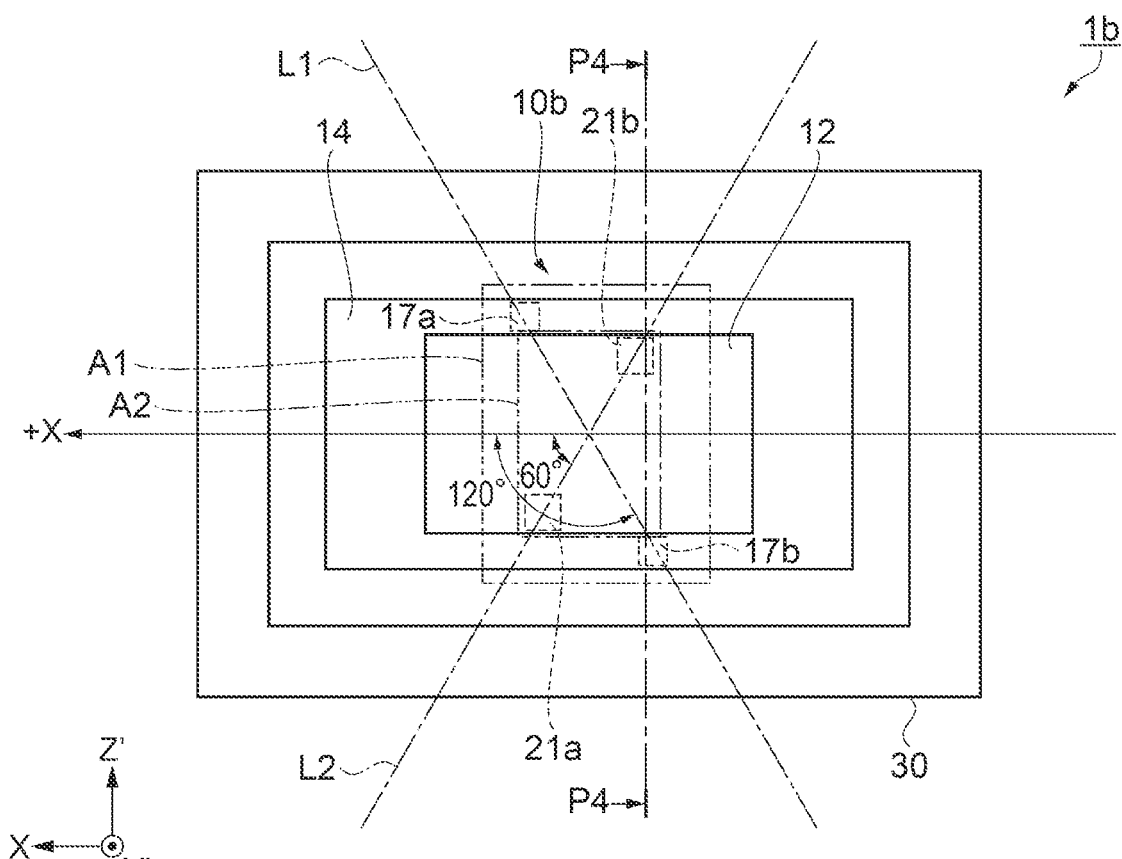
FIG. 4A is a schematic plan view illustrating a configuration of a vibrator device according to a third embodiment.

FIG. 4A is a schematic plan view illustrating a configuration of a vibrator device 1b according to the third embodiment. FIG. 4B is a schematic sectional view taken along the line P4-P4 in FIG. 4A. FIG. 4A illustrates a state where the lid member 42 is removed for convenience to describe an internal configuration of the vibrator device 1b. The differences from the embodiments described above will be described mainly, the same reference numerals will be assigned to the same configurations, and the description of the same matters will be omitted.

The vibrator device 1b according to the third embodiment has different structures and configurations of a vibration element 10b, a supporting member 18b, fixed portions 17a and 17b, and attaching portions 21a and 21b as compared with the vibrator device 1 according to the first embodiment.

Figure 4B:
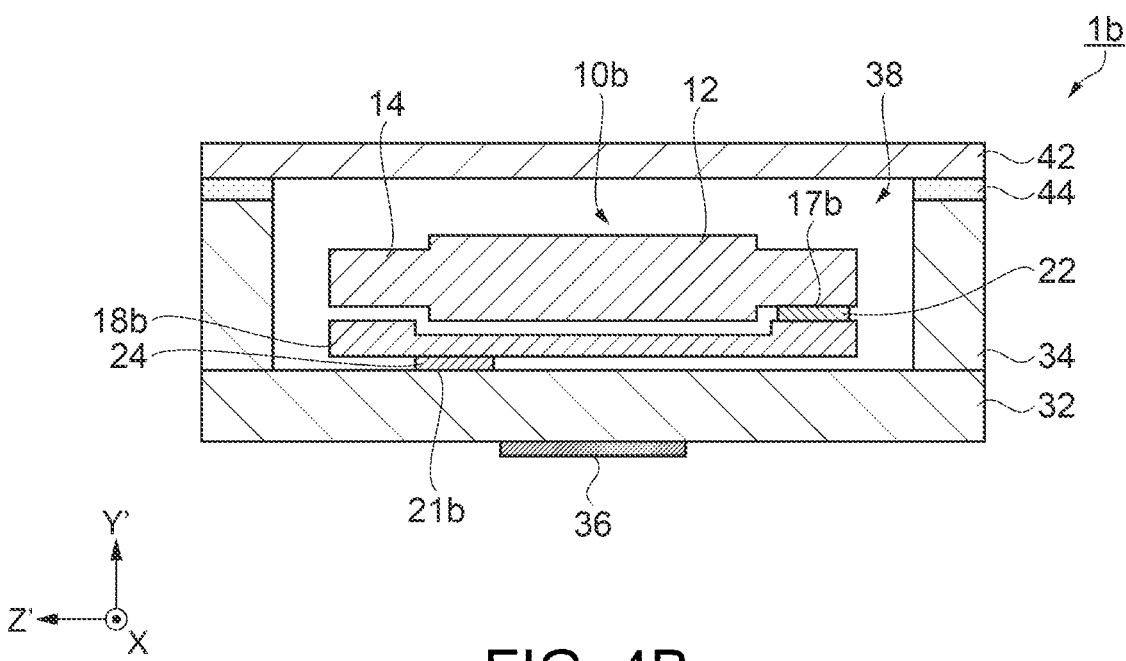
FIG. 4B is a schematic sectional view taken along the line P4-P4 in FIG. 4A.

As illustrated in FIGS. 4A and 4B, the vibrator device 1b of the embodiment is configured to have the vibration element 10b having projection portions in the center portion of the vibration element 10b made of the AT cut quartz crystal substrate, the supporting member 18b having a recessed portion in the center portion of the supporting member 18b made of the AT cut quartz crystal substrate, and the package body 30 for housing the vibration element 10b attached to the supporting member 18b.

The vibration element 10b has the rectangular shape in a plan view, the vibration portion 12 is disposed in the center portion of the longitudinal direction (X-axis direction), and two fixed portions 17a and 17b for attaching to the supporting member 18b are provided at positions interposing the center of the vibration portion 12 in a plan view, and in the thin portion 14 on a straight line L1 that intersects at 120° counterclockwise with respect to the +X-axis direction.

The supporting member 18b has substantially the same shape as the vibration element 10b in a plan view, and has the recessed portion on the upper surface of the vibration element 10b side. This is to prevent the vibration portion 12 of the vibration element 10b from contacting the supporting member 18b. In the supporting member 18b, two attaching portions 21a and 21b for attaching to the first substrate 32 are provided at the positions interposing the center of the vibration portion 12 in a plan view, and on a straight line L2 that intersects at 60° counterclockwise with respect to the +X-axis direction, in other words, the straight line L2 that intersects at 120° clockwise with respect to the +X-axis direction. That is, in FIG. 4A, the two attaching portions 21a and 21b are provided respectively at a position of the end portion in the −Z'-axis direction on the +X-axis direction side with respect to the center of the vibration portion 12, and at a position of the end portion in the +Z'-axis direction on the −X-axis direction side with respect to the center of the vibration portion 12. Here, the +X-axis direction of the vibration element 10b and the +X-axis direction of the supporting member 18b are the same direction.

It is known that the AT cut quartz crystal substrate has almost no frequency variation due to a compression stress at 60° and 120° counterclockwise with respect to the +X-axis direction in a plan view. This is considered a result of dependence on the Young's modulus in the in-plane direction of the AT cut quartz crystal substrate, and the two fixed portions 17a and 17b and the two attaching portions 21a and 21b are disposed on the straight lines L1 and L2 that intersect at 120° and 60° counterclockwise with respect to the +X-axis direction respectively using the characteristics.

As a result, the distortion due to the thermal stress caused by the difference in the thermal expansion coefficient between the supporting member 18b and the first substrate 32 generated between the two attaching portions 21a and 21b is hardly transferred to the two fixed portions 17a and 17b since the two fixed portions 17a and 17b are separated from the straight line L2 on which the two attaching portions 21a and 21b are disposed. Therefore, it is possible to make it difficult for the distortion due to the thermal stress caused by attaching of the supporting member 18b to the first substrate 32 to be transferred from the two fixed portions 17a and 17b to the vibration portion 12 of the vibration element 10b. Further, since a direction in which the stress applied to the vibration element 10b is maximized is the direction of 60° counterclockwise with respect to +X-axis direction of the AT cut quartz crystal substrate, it is possible to significantly suppress the frequency variation due to the stress generated in the substrate 32.

Since the area A2 including the two attaching portions 21a and 21b of the supporting member 18b attached to the first substrate 32 is designed to be smaller than the area A1 including the two fixed portions 17a and 17b of the vibration element 10b attached to the supporting member 18b, it is possible to obtain the same effects as the first embodiment. Further, the vibration portion 12 is disposed so as to overlap the rectangular region (A1) including the fixed portions 17a and 17b, and the rectangular region (A2) including the attaching portions 21a and 21b. Therefore, both ends in the longitudinal direction (X-axis direction) of the vibration element 10b are supported, and it is possible to prevent the vibration portion 12 from contacting the supporting member 18b and the first substrate 32.

As described above, it is known that the AT cut quartz crystal substrate has the characteristics in which the frequency change is zero with respect to the stress (distortion) from the direction of about 60° or about 120° from the X-axis (about ±30° from Z'-axis) in a X-Z' in-plane rotation (around Y'-axis). Therefore, it is possible to significantly alleviate the influence due to the distortion during the attaching to the supporting member 18b by disposing the two fixed portions 17a and 17b at the position in the direction of about 60° or about 120° from the X-axis with the vibration portion 12 interposed therebetween. For the supporting member 18b, it is possible to significantly alleviate the influence of the frequency variation due to the distortion during the attaching to the first substrate 32 by disposing the two attaching portions 21a and 21b at the position in the direction of about 60° or about 120° from the X-axis.

Since it is possible to keep the position where the two attaching portions 21a and 21b are disposed away from the position where the two fixed portions 17a and 17b are disposed by setting the crystal direction of the supporting member 18b in a direction intersecting with the crystal direction of the vibration element 10b, it is possible to significantly reduce the transfer of the distortion during the attaching to the first substrate 32 to the vibration portion 12 through the two fixed portions 17a and 17b.

As described above, it is possible to obtain the following effects with the vibrator device 1b according to the third embodiment.

Since the area A2 including the two attaching portions 21a and 21b of the supporting member 18b attached to the first substrate 32 is designed to be smaller than the area A1 including the two fixed portions 17a and 17b of the vibration element 10b attached to the supporting member 18b, that is, A1≥A2, when the vibrator device 1b is subjected to the temperature cycle such as the in-vehicle environment, it is possible to alleviate the distortion due to the thermal stress caused by the difference in the thermal expansion coefficient between the supporting member 18b and the first substrate 32, and to reduce the transfer of the distortion in which the first substrate 32 receives to the vibration element 10b. Accordingly, when the device is subjected to the temperature cycle, it is possible to obtain the vibrator device 1b in which the change in the vibration characteristics such as the frequency change is reduced.

When the supporting member 18b is attached to the first substrate 32, it is possible to alleviate the distortion due to the thermal stress caused by the difference in the thermal expansion coefficient between the supporting member 18b and the first substrate 32, and to reduce the transfer of the distortion when mounting the supporting member 18b to the vibration element 10b. Accordingly, it is possible to obtain the vibrator device 1b in which deterioration of the vibration characteristics such as the frequency change before and after mounting on the first substrate 32, and the aging change due to the distortion during the mounting is reduced.

Since the vibration portion 12 is disposed so as to overlap the rectangular region (A1) including the fixed portions 17a and 17b, and the rectangular region (A2) including the attaching portions 21a and 21b, the both ends in the X-axis direction of the vibration element 10b are supported, and it is possible to prevent the vibration portion 12 from contacting the supporting member 18b and the first substrate 32. Therefore, it is possible to obtain the vibrator device 1b having the stable vibration characteristics.

It is possible to keep the position where the two attaching portions 21a and 21b are disposed away from the position where the two fixed portions 17a and 17b are disposed by setting the crystal direction of the supporting member 18b in the direction intersecting with the crystal direction of the vibration element 10b in a plan view. Therefore, it is possible to significantly reduce the transfer of the distortion from the first substrate 32 to the vibration portion 12.

Fourth Embodiment

Next, a vibrator device 1c according to a fourth embodiment of the invention will be described with reference to FIGS. 5A and 5B citing a vibrator device in which a vibration gyro element 100 having a configuration referred to as a double T type is mounted as an example.

Figure 5A:
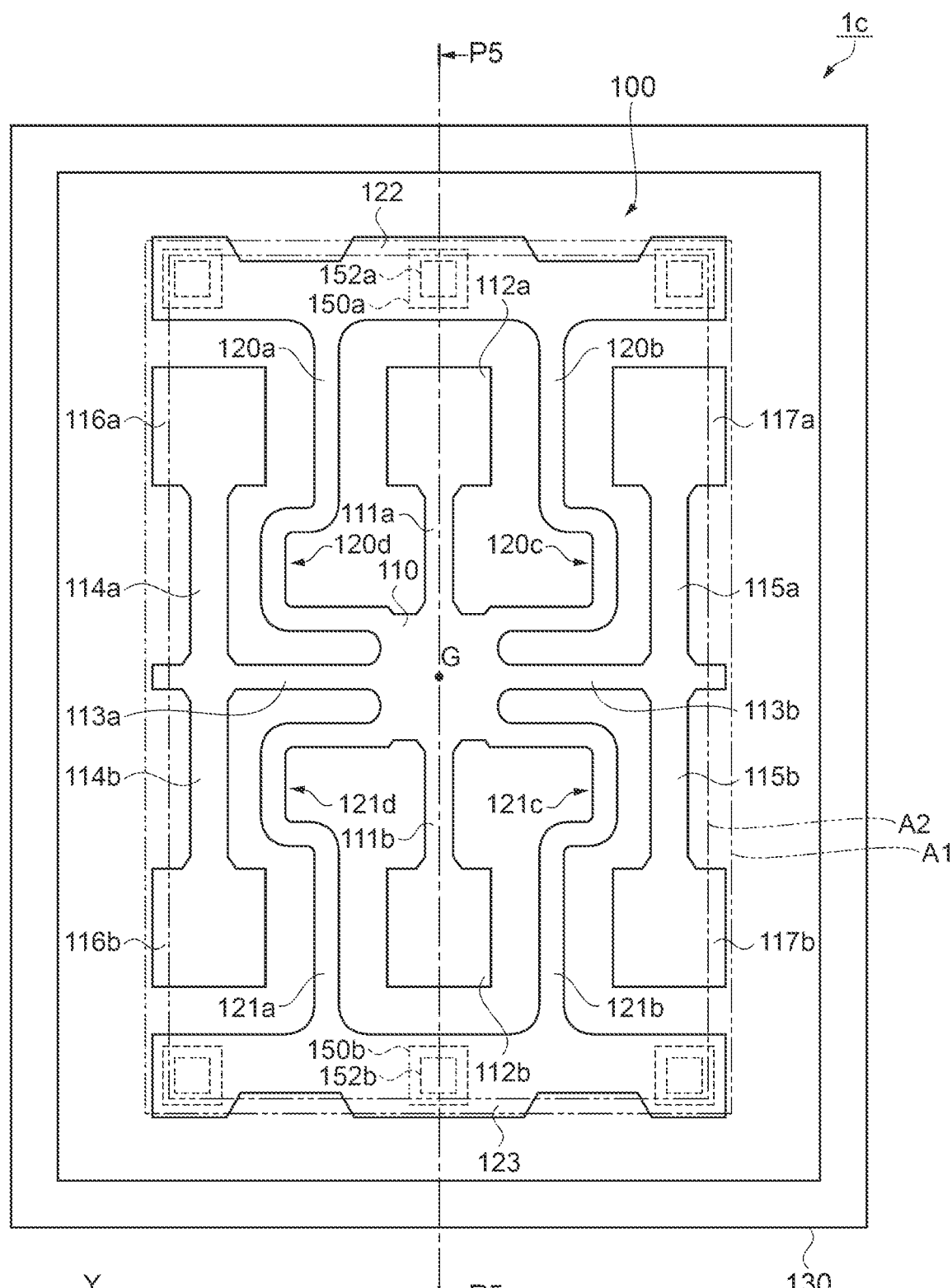
FIG. 5A is a schematic plan view illustrating a configuration of a vibrator device according to a fourth embodiment.

FIG. 5A is a schematic plan view illustrating a configuration of a vibrator device 1c according to the fourth embodiment. FIG. 5B is a schematic cross-sectional view taken along the line P5-P5 in FIG. 5A. FIG. 5A illustrates a state where the lid member 142 is removed for convenience to describe an internal configuration of the vibrator device 1c. In each drawing, for convenience of description, X-axis, Y-axis, and Z-axis as three axes orthogonal to one another are illustrated, and a plan view seen from the Z-axis direction is also referred to simply as "plan view". The differences from the embodiments described above will be described mainly, the same reference numerals will be assigned to the same configurations, and the description of the same matters will be omitted.

The vibrator device 1c according to the fourth embodiment has different structures and configurations of the vibration gyro element 100, a supporting member 102, fixed portions 150a and 150b, and attaching portions 152a and 152b as compared with the vibrator device 1 according to the first embodiment.

Figure 5B:
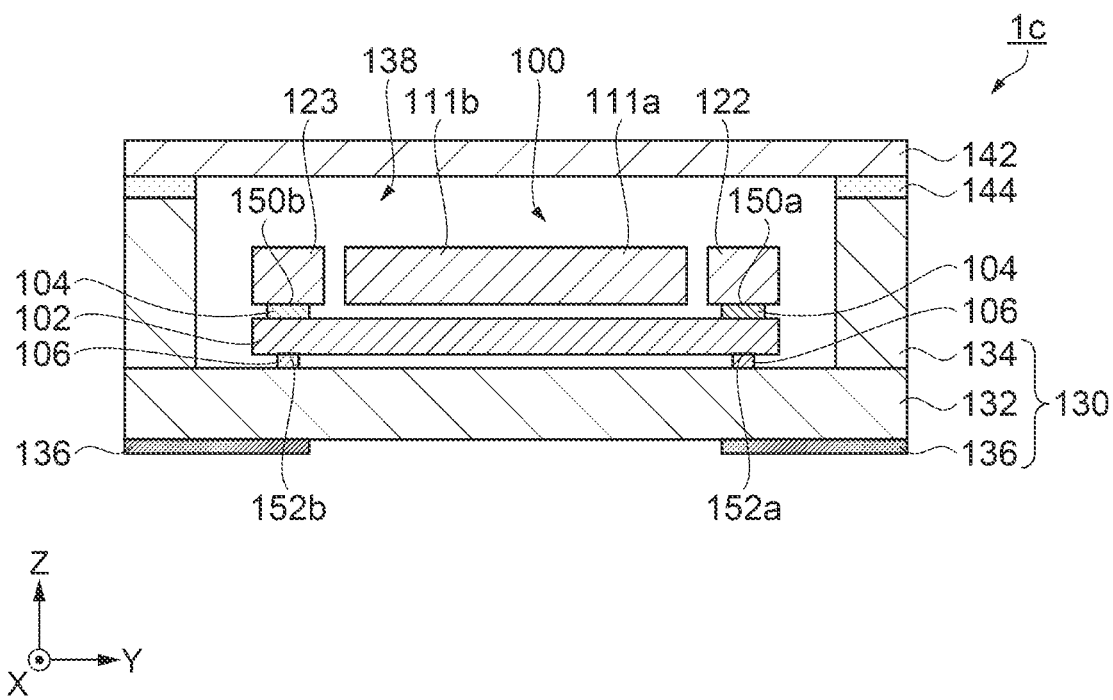
FIG. 5B is a schematic cross-sectional view taken along the line P5-P5 in FIG. 5A.

As illustrated in FIGS. 5A and 5B, the vibrator device 1c of the embodiment is configured to have the vibration gyro element 100 as the vibration element, the supporting member 102 supporting the vibration gyro element 100, and a package body 130 for housing the vibration gyro element 100 attached to the supporting member 102.

The vibration gyro element 100 is formed as a base material (material configuring main portion) of the quartz crystal which is a piezoelectric material. The quartz crystal has the X-axis is referred to as the electrical axis, the Y-axis is referred to as the mechanical axis, and the Z-axis is referred to as the optical axis.

The vibration gyro element 100 is cut along a plane defined by the X-axis and the Y-axis orthogonal to the quartz crystal axis, processed into the flat plate shape, and has a predetermined thickness in the Z-axis direction orthogonal to the plane. The predetermined thickness is set appropriately depending on an oscillation frequency (resonance frequency), an outer size, processability, or the like.

The flat plate forming the vibration gyro element 100 can allow an error in cut angle from the quartz crystal to some extent in each of the X-axis, the Y-axis, and the Z-axis. For example, it is possible to use a flat plate cut by rotating in a range of 0° to 2° centering on the X-axis. The same applies to the Y-axis and the Z-axis.

The vibration gyro element 100 is formed by etching (wet etching or dry etching) using a photolithography technique. It is possible to take a plurality of the vibration gyro elements 100 from one the quartz crystal wafer.

As illustrated in FIG. 5A, the vibration gyro element 100 has the configuration referred to as the double T type.

The vibration gyro element 100 includes a base portion 110 located at the center portion, a pair of detection vibrating arms 111a and 111b as the vibration portion in which one extends in the plus direction of the Y-axis and the other extends in the minus direction of the Y-axis linearly along the Y-axis from the base portion 110, a pair of connecting arms 113a and 113b in which one extends in the plus direction of the X-axis and the other extends in the minus direction of the X-axis linearly along the Y-axis from the base portion 110 so as to be orthogonal to the detection vibrating arms 111a and 111b, and each pair of drive vibrating arms 114a, 114b, 115a, and 115b as the vibration portion in which one extends in the plus direction of the Y-axis and the other extends in the minus direction of the Y-axis linearly along the Y-axis from the tip end sides of the respective connecting arms 113a and 113b so as to be parallel to the detection vibrating arms 111a and 111b.

In the vibration gyro element 100, a detection electrode (not illustrated) is formed on the detection vibrating arms 111a and 111b, and a drive electrode (not illustrated) is formed on the drive vibrating arms 114a, 114b, 115a, and 115b. In the vibration gyro element 100, the detection vibrating arms 111a and 111b configure a detection vibration system for detecting an angular velocity, and the connecting arms 113a and 113b and the drive vibrating arms 114a, 114b, 115a, and 115b configure a drive vibration system for driving the vibration gyro element 100.

Weight portions 112a and 112b are formed on respective tip end portions of the detection vibrating arms 111a and 111b, and weight portions 116a, 116b, 117a, and 117b are formed on respective tip end portions of the drive vibrating arms 114a, 114b, 115a, and 115b. With this, the vibration gyro element 100 achieves the miniaturization and the improvement of detection sensitivity of the angular velocity. The weight portions 112a and 112b are included in the detection vibrating arms 111a and 111b, and the weight portions 116a, 116b, 117a, and 117b are included in the drive vibrating arms 114a, 114b, 115a, and 115b.

Further, in the vibration gyro element 100, four supporting arms 120a, 120b, 121a, and 121b extend from the base portion 110.

The supporting arm 120a includes a meandering shape portion 120d that extends to the minus side in the X-axis direction from an outer edge of the base portion 110 between the connecting arm 113a and the detection vibrating arm 111a, then extends to the plus side in the Y-axis direction, then extends to the plus side in the X-axis direction, and then extends to the plus side in the Y-axis direction again.

The supporting arm 120b includes a meandering shape portion 120c that extends to the plus side in the X-axis direction from an outer edge of the base portion 110 between the connecting arm 113b and the detection vibrating arm 111a, then extends to the plus side in the Y-axis direction, then extends to the minus side in the X-axis direction, and then extends to the plus side in the Y-axis direction again.

The supporting arm 121a includes a meandering shape portion 121d that extends to the minus side in the X-axis direction from an outer edge of the base portion 110 between the connecting arm 113a and the detection vibrating arm 111b, then extends to the minus side in the Y-axis direction, then extends to the plus side in the X-axis direction, and then extends to the minus side in the Y-axis direction again.

The supporting arm 121b includes a meandering shape portion 121c that extends to the plus side in the X-axis direction from an outer edge of the base portion 110 between the connecting arm 113b and the detection vibrating arm 111b, then extends to the minus side in the Y-axis direction, then extends to the minus side in the X-axis direction, and then extends to the minus side in the Y-axis direction again.

Each of supporting arms 120a, 120b, 121a, and 121b of the vibration gyro element 100 is rotationally symmetric with respect to the center of gravity G of the vibration gyro element 100. Specifically, the supporting arm 120a and the supporting arm 121b have a rotationally symmetrical shape with respect to the center of gravity G of the vibration gyro element 100 as a rotation center, and the supporting arm 121a and the supporting arm 120b have the rotationally symmetrical shape with respect to the center of gravity G of the vibration gyro element 100 as the rotation center.

The tip end portions of the supporting arms 120a and 120b are connected to a supporting portion 122 located on the plus side with respect to the detection vibrating arm 111a in the Y-axis direction and extending along the X-axis, and the tip end portions of the supporting arms 121a and 121b are connected to a supporting portion 123 located on the minus side with respect to the detection vibrating arm 111b in the Y-axis direction and extending along the X-axis.

Three fixed portions 150a are provided in the supporting portion 122 along the X-axis, and three fixed portions 150b are provided in the supporting portion 123 along the X-axis.

It is preferable from the viewpoint of balance that the supporting portion 122 and the supporting portion 123 have the rotationally symmetrical shape with respect to the center of gravity G of the vibration gyro element 100 as the rotation center.

The supporting member 102 has the rectangular form in a plan view and has substantially the same area as a rectangular region including the supporting portions 122 and 123 of the vibration gyro element 100. In the supporting member 102, three attaching portions 152a and 152b are provided respectively on a surface of the supporting member 102 opposite to a surface facing the vibration gyro element 100, on both end sides in the direction (Y-axis direction) to which the detection vibrating arms 111a and 111b of the vibration gyro element 100 extend, along the direction (X-axis direction) intersecting with the direction to which the detection vibrating arms 111a and 111b extend.

The three attaching portion 152a provided on the plus side in the Y-axis direction on the surface of the supporting member 102 opposite to the surface facing the vibration gyro element 100 are disposed to face the three fixed portions 150a provided in the supporting portion 122 of the vibration gyro element 100, respectively. The three attaching portion 152b provided on the minus side in the Y-axis direction on the surface of the supporting member 102 opposite to the surface facing the vibration gyro element 100 are disposed to face the three fixed portions 150b provided in the supporting portion 123 of the vibration gyro element 100, respectively.

The vibration gyro element 100 is attached to the supporting member 102 through an attaching member 104 such as the conductive adhesive in the three fixed portions 150a and 150b aligned along the X-axis provided in the supporting portions 122 and 123.

The supporting member 102 to which the vibration gyro element 100 is attached is attached to a first substrate 132 of the package body 130 through an attaching member 106 such as the conductive adhesive in the three attaching portions 152a and 152b aligned along the X-axis at both ends in the Y-axis direction of the supporting member 102.

Since an area A2 including six attaching portions 152a and 152b of the supporting member 102 attached to the first substrate 132 is designed to be smaller than an area A1 including six fixed portions 150a and 150b of the vibration gyro element 100 attached to the supporting member 102, it is possible to obtain the same effects as the first embodiment.

Further, the detection vibrating arms 111a and 111b and the drive vibrating arms 114a, 114b, 115a, and 115b as the vibration portion are disposed so as to overlap a rectangular region (A1) including the fixed portions 150a and 150b and a rectangular region (A2) including the attaching portions 152a and 152b. Therefore, the vicinity of vibration regions (detection vibrating arms 111a and 111b and the drive vibrating arms 114a, 114b, 115a, and 115b) is supported, and it is possible to prevent the vibration regions from contacting the supporting member 102 and the first substrate 132.

As described above, the following effects can be obtained with the vibrator device 1c according to the fourth embodiment.

Since the area A2 including the six attaching portions 152a and 152b of the supporting member 102 attached to the first substrate 132 is designed to be smaller than the area A1 including the six fixed portions 150a and 150b of the vibration gyro element 100 attached to the supporting member 102, that is, A1≥A2, when the vibrator device 1c is subjected to the temperature cycle such as the in-vehicle environment, it is possible to alleviate the distortion due to the thermal stress caused by the difference in the thermal expansion coefficient between the supporting member 102 and the first substrate 132, and to reduce the transfer of the distortion in which the first substrate 132 receives to the vibration gyro element 100. Accordingly, when the device is subjected to the temperature cycle, it is possible to obtain the vibrator device 1c in which the change in the vibration characteristics such as the frequency change is reduced.

When the supporting member 102 is attached to the first substrate 132, it is possible to alleviate the distortion due to the thermal stress caused by the difference in the thermal expansion coefficient between the supporting member 102 and the first substrate 132, and to reduce the transfer of the distortion when mounting the supporting member 102 to the vibration gyro element 100. Accordingly, it is possible to obtain the vibrator device 1c in which deterioration of the vibration characteristics such as the frequency change before and after mounting on the first substrate 132, and the aging change due to the distortion during the mounting is reduced.

Since the meandering shape portions 120c, 120d, 121c, and 121d for alleviating the distortion generated during attaching the vibration gyro element 100 to the supporting arms 120a, 120b, 121a, and 121b extending from the base portion 110 are included, it is possible to reduce the influence of the distortion due to the thermal stress during the attaching the vibration gyro element 100 by deformation of the meandering shape portions 120c, 120d, 121c, and 121d when the fixed portions 150a and 150b are attached to the supporting member 102.

The vibration regions (detection vibrating arms 111a and 111b and the drive vibrating arms 114a, 114b, 115a, and 115b) are disposed so as to overlap the rectangular region (A1) including the fixed portions 150a and 150b and the rectangular region (A2) including the attaching portions 152a and 152b. Therefore, the vicinity of the vibration regions is supported, and it is possible to prevent the vibration region from contacting the supporting member 102 and the first substrate 132. Therefore, it is possible to obtain the vibrator device 1c having the stable vibration characteristics.

Oscillator

Next, an oscillator 200 including at least one of vibrator devices 1 to 1b according to one embodiment of the invention will be described with reference to FIG. 6.

Figure 6:
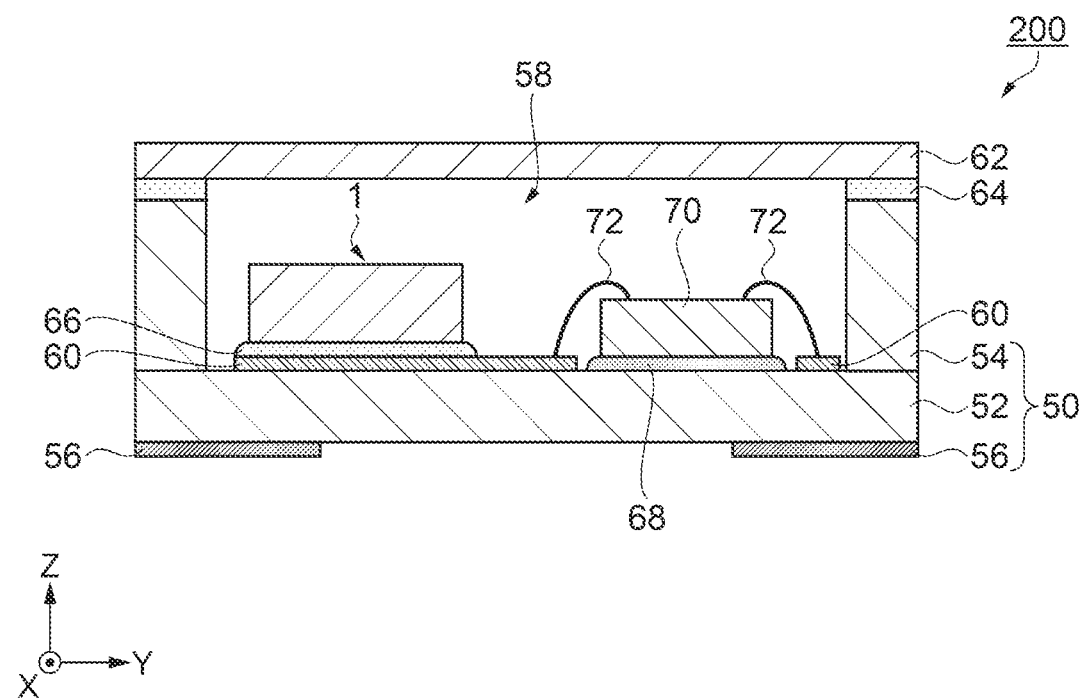
FIG. 6 is a schematic cross-sectional view illustrating a configuration of an oscillator according to the embodiment.

FIG. 6 is a schematic cross-sectional view illustrating a structure of the oscillator 200 including the vibrator device 1 of the embodiment of the invention. For convenience of description, the X-axis, the Y-axis, and the Z-axis as three axes orthogonal to one another are illustrated.

The oscillator 200 is configured to have the vibrator device 1, an IC chip (chip part) 70 having the oscillation circuit for oscillating the vibrator device 1, a package body 50 for housing the vibrator device 1 and the IC chip 70 in a cavity 58, and a lid member 62 made of glass, ceramics, metal, or the like.

As illustrated in FIG. 6, the package body 50 is formed by stacking a first substrate 52, a second substrate 54, and a mounting terminal 56. The package body 50 has the cavity 58 that opens to the vibrator device 1 and the IC chip 70 side.

A plurality of internal electrodes 60 are provided on a surface of the cavity 58 side on the first substrate 52 corresponding to the mounting substrate or the like, and a plurality of mounting terminals 56 are provide on a surface on a side opposite to the surface of the cavity 58 side of the first substrate 52. The internal electrodes 60 and the mounting terminals 56 are conducted electrically through a penetration electrode and an interlayer wiring (not illustrated).

In the cavity 58 of the package body 50, the vibrator device 1 is attached on the internal electrodes 60 provided in the first substrate 52 through an attaching member 66 such as the adhesive having conductivity, and the IC chip 70 is attached and fixed on the first substrate 52 through an attaching member 68 such as a brazing material or the adhesive. The IC chip 70 is conducted electrically with the internal electrodes 60 by bonding wires 72. The inside of the cavity 58 is hermetically sealed by attaching the lid member 62 with a sealing member 64 such as borosilicate glass.

The IC chip 70 has the oscillation circuit for controlling the oscillation of the vibrator device 1 (vibration element 10), and the vibration element 10 can be oscillated and a predetermined oscillation frequency can be output by applying a voltage to the vibration element 10 through the internal electrodes 60 by the oscillation circuit.

Accordingly, it is possible to obtain the oscillator 200 capable of stably extracting a desired resonance frequency by including the vibrator devices 1 to 1b in which the influence of the distortion due to the thermal stress during the mounting of the vibration elements 10 and 10b is reduced.

Gyro Sensor

Next, a gyro sensor 300 including the vibrator device 1c (vibration gyro element 100) according to one embodiment of the invention will be described with reference to FIG. 7.

Figure 7:
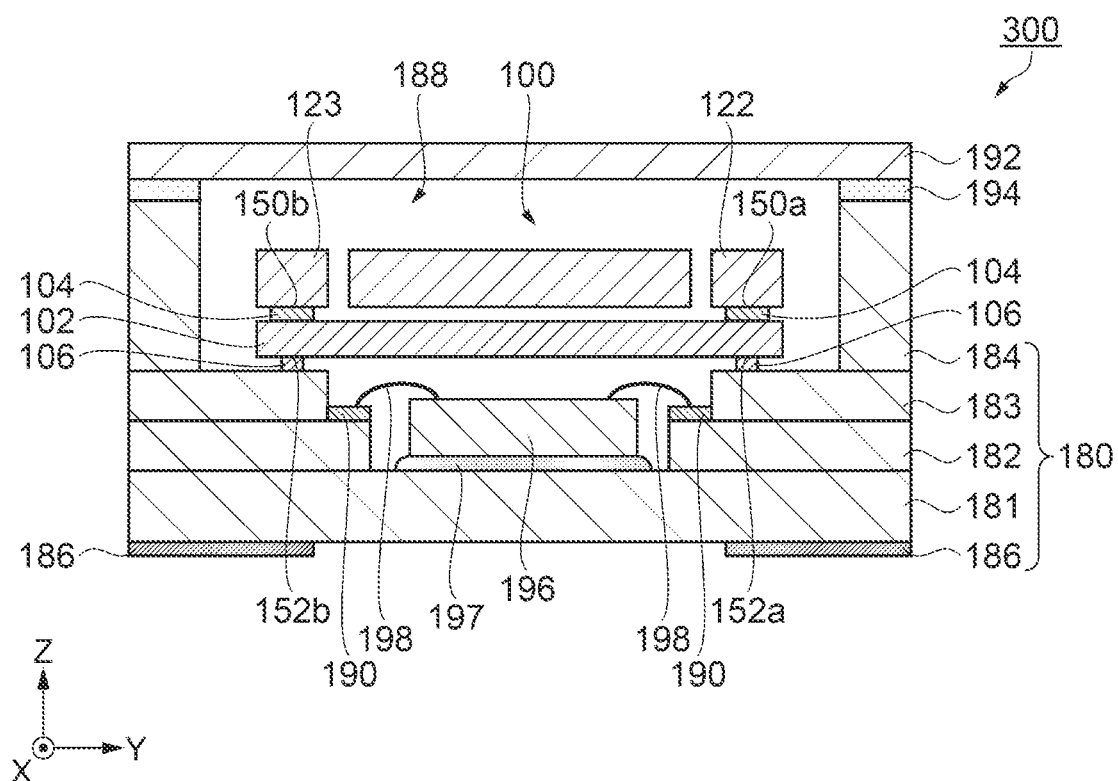
FIG. 7 is a schematic cross-sectional view illustrating a configuration of a gyro sensor according to the embodiment.

FIG. 7 is a schematic cross-sectional view illustrating a structure of the gyro sensor 300 including the vibrator device 1c of the embodiment of the invention. For convenience of description, the X-axis, the Y-axis, and the Z-axis as three axes orthogonal to one another are illustrated, and are the same as the axes used in FIGS. 5A and 5B.

As illustrated in FIG. 7, the gyro sensor 300 is configured to have the vibration gyro element 100, the supporting member 102, an IC chip 196 having a drive circuit for driving the vibration gyro element 100, a package body 180, and a lid member 192.

The package body 180 formed of the ceramics or the like and having the inside of a cavity 188 configured by three recessed portions is formed by stacking a first substrate 181, a second substrate 182, a third substrate 183, the fourth substrate 184, and mounting terminals 186.

In the cavity 188 of the package body 180, the IC chip 196 is attached on the first substrate 181 through an attaching member 197 such as the brazing material or the adhesive. The IC chip 196 is conducted electrically with an internal electrodes 190 provided in the second substrate 182 by bonding wires 198. The IC chip 196 includes the drive circuit for driving and vibrating the vibration gyro element 100 and a detection circuit for detecting a detection vibration generated in the vibration gyro element 100 when an angular velocity is applied.

In the vibration gyro element 100, similarly to the vibrator device 1c described above, six fixed portions 150a and 150b provided in the supporting portions 122 and 123 are attached to the supporting member 102 through the attaching member 104. In the supporting member 102 to which the vibration gyro element 100 is attached, six attaching portions 152a and 152b provided in end portions in the Y-axis direction of the supporting member 102 are attached on the third substrate 183 through the attaching member 106.

An internal electrode (not illustrated) is provided in the third substrate 183, and is conducted electrically with a drive electrode and a detection electrode (not illustrated) provided in the vibration gyro element 100. The internal electrode is conducted electrically with the internal electrodes 190 provided on the second substrate 182 and the mounting terminals 186 provided on the first substrate 181 through the penetration electrode and the interlayer wiring (not illustrated).

The inside of the cavity 188 of the gyro sensor 300 is maintained in a substantially vacuum or reduced pressure atmosphere and is hermetically sealed by attaching a lid member 193 with a sealing member 194 such as the borosilicate glass.

Accordingly, it is possible to obtain the gyro sensor 300 having a highly accurate detection function by including the vibrator device 1c in which the influence of the distortion due to the thermal stress is reduced.

Electronic Apparatus

Next, an electronic apparatus in which at least one of vibrator devices 1 to 1c according to one embodiment of the invention is employed will be described with reference to FIGS. 8, 9, and 10. The following examples illustrate only one vibrator device 1, but two or more vibrator devices 1 to 1c may be mounted, the two or more vibrator devices 1 to 1c may be the same, or different two or more vibrator devices 1 to 1c may be employed.

Figure 8:
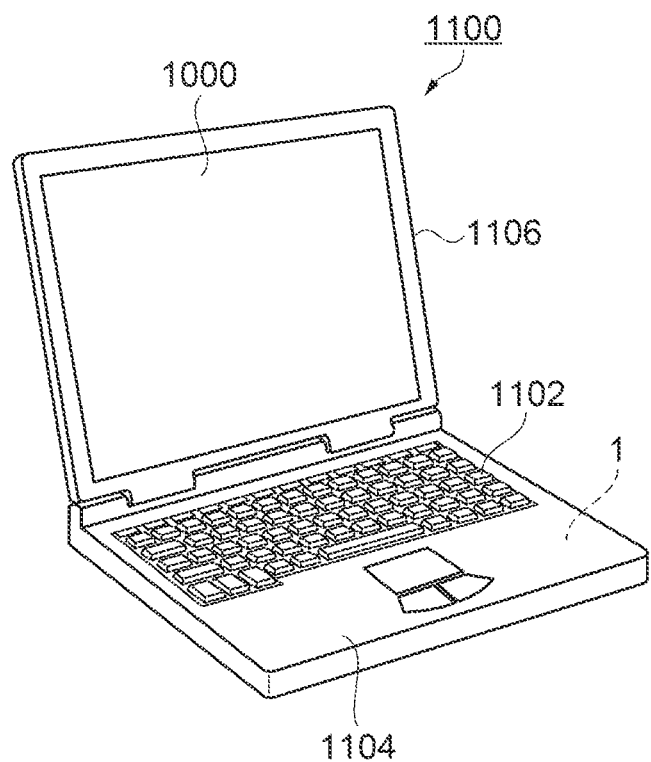
FIG. 8 is a perspective view illustrating a configuration of a mobile-type personal computer as an example of an electronic apparatus.

FIG. 8 is a perspective view schematically illustrating a configuration of a mobile-type (or note-type) personal computer as the electronic apparatus including the vibrator device 1 according to the embodiment. In the figure, a personal computer 1100 is configured by a main body portion 1104 including a keyboard 1102 and a display unit 1106 including a display 1000, and the display unit 1106 is supported rotatably with respect to the main body portion 1104 through a hinge structure portion. In such personal computer 1100, the vibrator device 1 functioning as a reference clock or the like is included.

Figure 9:
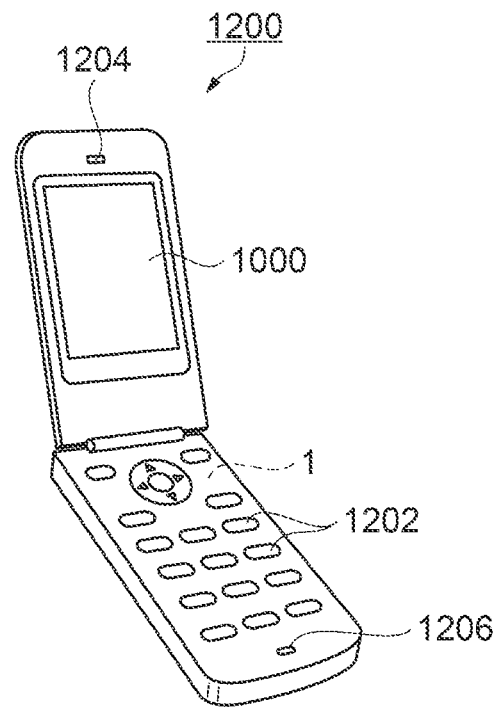
FIG. 9 is a perspective view illustrating a configuration of a mobile phone as an example of the electronic apparatus.

FIG. 9 is a perspective view schematically illustrating a configuration of a mobile phone (including personal handy-phone system (PHS) and smartphone) as the electronic apparatus including the vibrator device 1 according to one embodiment of the invention. In the figure, a mobile phone 1200 includes a plurality of operation buttons 1202, a reception port 1204, and a transmission port 1206, and the display 1000 is disposed between the operation buttons 1202 and the reception port 1204. In such mobile phone 1200, the vibrator device 1 functioning as the reference clock or the like is included.

Figure 10:
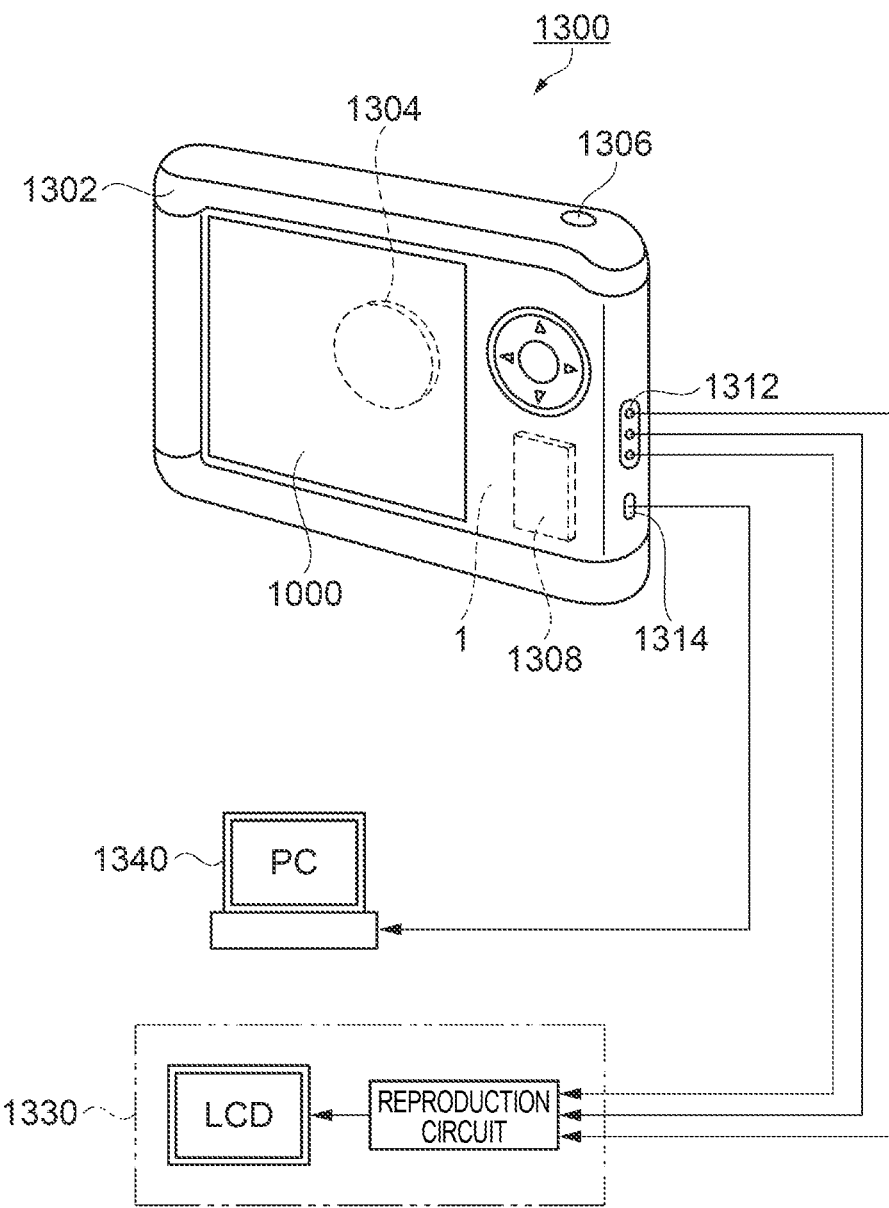
FIG. 10 is a perspective view illustrating a configuration of a digital still camera as an example of the electronic apparatus.

FIG. 10 is a perspective view schematically illustrating a configuration of a digital still camera as the electronic apparatus including the vibrator device 1 according to one embodiment of the invention. The figure also briefly illustrates a connection with external apparatuses. A digital still camera 1300 photoelectrically converts an optical image of a subject with an image capturing element such as a charge coupled device (CCD) to generate a captured image signal (image signal).

The display 1000 is provided on the back of a case (body) 1302 in the digital still camera 1300 and is configured to perform display based on the captured image signal of the CCD, and the display 1000 functions as a finder displaying the subject as an electronic image. A light receiving unit 1304 including an optical lens (image capturing optical system), the CCD, and the like is provided on the front side (back side in figure) of the case 1302.

When a photographer confirms a subject image displayed on the display 1000 and presses a shutter button 1306, a captured image signal of the CCD at the time is transmitted and stored in a memory 1308. In the digital still camera 1300, video signal output terminals 1312 and an input output terminal for data communication are provided on the side of the case 1302. As illustrated in the figure, a television monitor 1330 is connected to the video signal output terminal 1312, and a personal computer 1340 is connected to the input output terminal 1314 for data communication as necessary, respectively. Further, it is configured to output the captured image signal stored in the memory 1308 to the television monitor 1330 or the personal computer 1340 by a predetermined operation. In such digital still camera 1300, the vibrator device 1 functioning as the reference clock or the like is included.

As described above, it is possible to obtain a high performance electronic apparatus by including the vibrator devices 1 to 1c in which the influence of the distortion due to the thermal stress is reduced as the electronic apparatus.

The vibrator devices 1 to 1c according to one embodiment of the invention can be employed in an electronic apparatus such as an ink jet ejecting apparatus (for example, ink jet printer), a laptop-type personal computer, a television, a video camera, a car navigation apparatus, a pager, an electronic notebook (including communication function), an electronic dictionary, an electronic calculator, an electronic game apparatus, a workstation, a video telephone, a monitoring television monitor, an electronic binoculars, a point of sale (POS) terminal, a medical apparatus (for example, an electronic thermometer, a sphygmomanometer, a blood glucose meter, an electrocardiogram measurement apparatus, an ultrasonic diagnostic apparatus, and an electronic endoscope), a fish finder, various measurement apparatuses, instruments (for example, instruments of a vehicle, an aircraft, or a ship), and a flight simulator in addition to the personal computer 1100 (mobile-type personal computer) in FIG. 8, the mobile phone 1200 in FIG. 9, and the digital still camera 1300 in FIG. 10.

Vehicle

Next, a vehicle in which the vibrator devices 1 to 1c according to one embodiment of the invention are employed will be described.

Figure 11:
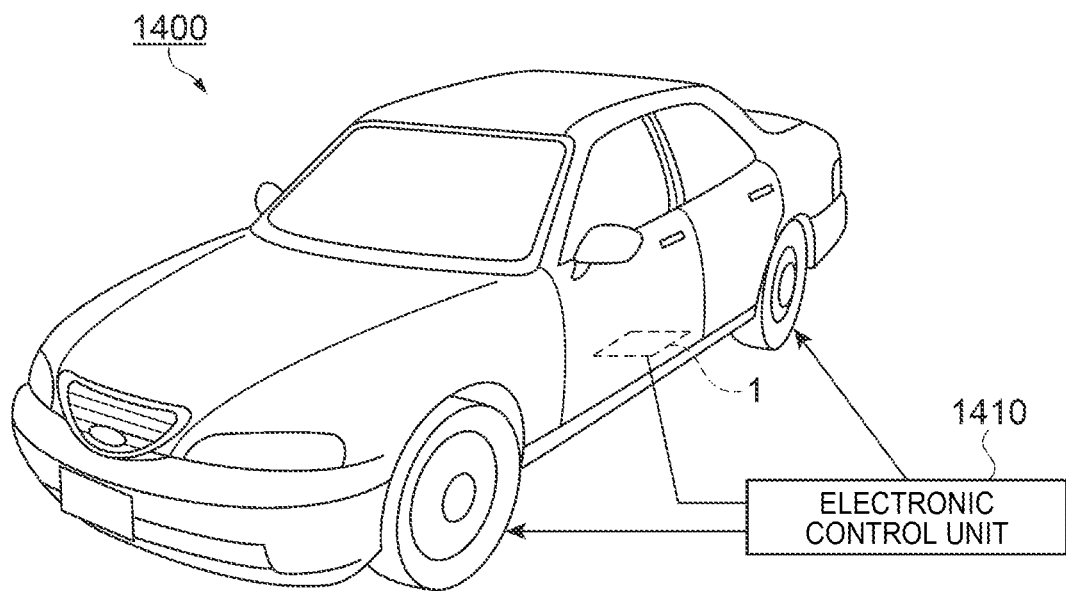
FIG. 11 is a perspective view schematically illustrating a vehicle as an example of a vehicle.

FIG. 11 is a perspective view schematically illustrating a vehicle 1400 as an example of the vehicle according to the invention. The vibrator device 1 is included in the vehicle 1400. The vibrator device 1 can be employed widely in an electronic control unit (ECU) 1410 such as a keyless entry, an immobilizer, a navigation system, an air conditioner, an antilock brake system (ABS), a tire pressure monitoring system (TPMS), engine control, a battery monitor for a hybrid vehicle or an electric vehicle, and a vehicle body altitude control system.

As described above, it is possible to obtain a high performance vehicle by including the vibrator devices 1 to 1b in which the influence of the distortion due to the thermal stress is reduced as the vehicle.

The vibrator devices 1 to 1c of the embodiments of the invention, the oscillator 200, the gyro sensor 300, the electronic apparatus (1100, 1200, and 1300), and the vehicle (1400) are described based on the illustrated embodiments, but the invention is not limited thereto, and the configuration of each portion can be replaced by an arbitrary configuration having the same function. Another arbitrary component may be added to the invention. The respective embodiments described above may be combined appropriately.

The entire disclosure of Japanese Patent Application No. 2017-058706, filed Mar. 24, 2017 is expressly incorporated by reference herein.

What is claimed is:

1. A vibrator device comprising:
    a vibration element that includes a vibration member and a fixed member;
    a supporting member to which the fixed member is attached so as to support the vibration element; and
    a substrate having an attaching member, the supporting member being attached to the substrate via the attaching member,
    wherein A1≥A2 is satisfied when an area of a rectangular region including the fixed member is the A1 and an area of a rectangular region including the attaching member is the A2 in a plan view seen from a thickness direction of the vibration element, and
    wherein at least a part of the supporting member is made of the same material as the vibration element.

2. The vibrator device according to claim 1,
wherein the vibration member includes a region overlapping the rectangular region including the fixed member and the rectangular region including the attaching member in the plan view.

3. An oscillator comprising:
the vibrator device according to claim 2; and
an oscillation circuit configured to oscillate the vibrator device.

4. An electronic apparatus comprising:
the vibrator device according to claim 2, the vibrator device being configured to generate a clock signal;
a display; and
a case that houses the vibrator device and the display.

5. The vibrator device according to claim 1,
wherein $0.1 \leq (A2/A1) \leq 1.0$ is satisfied.

6. A vehicle comprising:
the vibrator device according to claim 2; and
an electronic control unit configured to control vehicle components.

7. An electronic apparatus comprising:
the vibrator device according to claim 5, the vibrator device being configured to generate a clock signal;
a display; and
a case that houses the vibrator device and the display.

8. The vibrator device according to claim 5,
wherein $0.5 \leq (A2/A1) \leq 0.8$ is satisfied.

9. An oscillator comprising:
the vibrator device according to claim 5; and
an oscillation circuit configured to oscillate the vibrator device.

10. The vibrator device according to claim 1,
wherein the supporting member includes a first crystal material having a first crystal orientation, and
the vibration element includes the first crystal material and a second crystal material having a second crystal orientation that is different from the first crystal orientation in the plan view.

11. The vibrator device according to claim 1, wherein an aspect ratio of the supporting member is different from an aspect ratio of the vibration element in the plan view.

12. The vibrator device according to claim 1,
wherein the substrate includes a plurality of external connectors, and
wherein $A3 \geq A2$ is satisfied when an area of a rectangular region including the plurality of external connectors is the A3 in the plan view.

13. The vibrator device according to claim 12,
wherein $1 \leq (A2/A3) \leq 100$ is satisfied.

14. The vibrator device according to claim 12,
wherein $2 \leq (A2/A3) \leq 5$ is satisfied.

15. The vibrator device according to claim 1,
wherein the vibration element further includes a base member, the vibration member extending from the base member, and a plurality of supporting arms extending from the base member, and
wherein each of the plurality of supporting arms includes the fixed member and a meandering shape member.

16. A gyro sensor comprising:
the vibrator device according to claim 15; and
a drive circuit configured to drive the vibrator device.

17. An oscillator comprising:
the vibrator device according to claim 1; and
an oscillation circuit configured to oscillate the vibrator device.

18. An electronic apparatus comprising:
the vibrator device according to claim 1, the vibrator device being configured to generate a clock signal;
a display; and
a case that houses the vibrator and the display.

19. A vehicle comprising:
the vibrator device according to claim 1; and
an electronic control unit configured to control vehicle components.

* * * * *